US012396309B2

(12) United States Patent
Yang et al.

(10) Patent No.: US 12,396,309 B2
(45) Date of Patent: Aug. 19, 2025

(54) ARRAY SUBSTRATE, BACKLIGHT, DISPLAY DEVICE

(71) Applicant: BOE TECHNOLOGY GROUP CO., LTD., Beijing (CN)

(72) Inventors: Ming Yang, Beijing (CN); Xingce Shang, Beijing (CN); Wei Hao, Beijing (CN); Zhenyu Zhang, Beijing (CN); Fuqiang Li, Beijing (CN); Wanzhi Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 17/756,513

(22) PCT Filed: Jun. 25, 2021

(86) PCT No.: PCT/CN2021/102528
§ 371 (c)(1),
(2) Date: Dec. 29, 2022

(87) PCT Pub. No.: WO2022/267052
PCT Pub. Date: Dec. 29, 2022

(65) Prior Publication Data
US 2024/0234657 A1 Jul. 11, 2024

(51) Int. Cl.
H10H 20/857 (2025.01)
H01L 25/075 (2006.01)

(52) U.S. Cl.
CPC ....... H10H 20/857 (2025.01); H01L 25/0753 (2013.01)

(58) Field of Classification Search
CPC . H10H 20/857; H01L 25/0753; G02F 1/1362; G09G 3/32
See application file for complete search history.

(56) References Cited

U.S. PATENT DOCUMENTS 10,878,734 B1 * 12/2020 Watsuda .................. G09G 3/32
2012/0218242 A1 * 8/2012 Ho ......................... H10K 59/50
257/E33.012

(Continued)

FOREIGN PATENT DOCUMENTS

CN 102810296 A 12/2012
CN 109461405 A 3/2019

(Continued)

OTHER PUBLICATIONS

Novelty Search Report with Translation dated Mar. 23, 2021, 12 pages.

Primary Examiner — Victor A Mandala
(74) Attorney, Agent, or Firm — Myers Bigel, P.A.

(57) ABSTRACT

The present disclosure provides an array substrate, a backlight and a display device which both include the array substrate. The array substrate includes multiple light-emitting units arranged in M rows and N columns and multiple first signal lines. Multiple first signal lines are divided into N groups, and each group of first signal lines is electrically connected to a column of light-emitting units. Each group of first signal lines includes at least two first signal lines, for each column of light-emitting units, at least two consecutive rows of light-emitting units are electrically connected to one of the at least two first signal lines, and the remaining at least one row of light-emitting unit is electrically connected to the other one of the at least two first signal lines, M is a positive integer greater than or equal to 3, N is a positive integer greater than or equal to 1.

24 Claims, 12 Drawing Sheets

(56) References Cited

U.S. PATENT DOCUMENTS

| | | | |
|---|---|---|---|
| 2014/0049457 A1 | 2/2014 | Hwang | |
| 2016/0148563 A1 | 5/2016 | Tsuge | |
| 2020/0135808 A1 | 4/2020 | Yang et al. | |
| 2020/0135973 A1* | 4/2020 | Ma | H10H 20/857 |
| 2021/0005631 A1* | 1/2021 | Wang | H10D 86/60 |
| 2021/0327342 A1* | 10/2021 | Dong | G02F 1/163 |
| 2022/0005989 A1 | 1/2022 | Ban et al. | |
| 2022/0068193 A1 | 3/2022 | Wang et al. | |
| 2023/0152632 A1* | 5/2023 | Yang | G02F 1/133616 345/690 |
| 2023/0154386 A1* | 5/2023 | Yang | G09G 3/3426 |

FOREIGN PATENT DOCUMENTS

| | | |
|---|---|---|
| CN | 110972495 A | 4/2020 |
| CN | 111103726 A | 5/2020 |
| CN | 111968566 A | 11/2020 |
| CN | 112180644 A | 1/2021 |
| CN | 112230471 A | 1/2021 |

\* cited by examiner

ARRAY SUBSTRATE, BACKLIGHT, DISPLAY DEVICE

RELATED APPLICATIONS

The present application is a 35 U.S.C. 371 national stage application of PCT International Application No. PCT/CN2021/102528 filed on Jun. 25, 2021, the entire disclosure of which is incorporated herein by reference.

TECHNICAL FIELD

The present disclosure relates to the field of display, and in particular, to an array substrate, a backlight comprising the array substrate, and a display device comprising the array substrate.

BACKGROUND

With the continuous development of display technology, users have put forward higher and higher requirements on the contrast, brightness uniformity and screen ratio of the display device. Display devices are generally divided into two categories: liquid crystal display devices and organic light-emitting diode display devices. Liquid crystal display devices are widely used due to their advantages of thinness, good shock resistance, wide viewing angle, and high contrast. A liquid crystal display device generally comprises a display panel and a backlight, and the backlight is usually disposed on a non-display side of the display panel to provide a light source for display operations of the display panel. The characteristics of the liquid crystal display device, such as contrast, brightness uniformity, and screen ratio, are related to the structure and performance of the backlight.

SUMMARY

According to an aspect of the present disclosure, there is provided an array substrate. The array substrate comprises a plurality of light-emitting units arranged in an array, the plurality of light-emitting units being arranged in M rows along a first direction and in N columns along a second direction intersecting with the first direction; and a plurality of first signal lines extending along the first direction, the plurality of first signal lines being divided into N groups, the N groups of first signal lines being in one-to-one correspondence with the N columns of light-emitting units, and each of the N groups of first signal lines being electrically connected to a column of light-emitting units corresponding to the group of first signal lines. Each group of first signal lines comprises at least two first signal lines, for each column of light-emitting units, at least two consecutive rows of light-emitting units in the column of light-emitting units are electrically connected to one of the at least two first signal lines, and the remaining at least one row of light-emitting unit in the column of light-emitting units except the at least two consecutive rows of light-emitting units is electrically connected to the other one of the at least two first signal lines, M is a positive integer greater than or equal to 3, and N is a positive integer greater than or equal to 1.

In some embodiments, each group of first signal lines comprises P first signal lines, and for each column of light-emitting units, the light-emitting units in the row $(1+(M/P)*(i-1))^{th}$ to the row $((M/P)*i)^{th}$ of the column of light-emitting units are all electrically connected to the $i^{th}$ first signal line among the P first signal lines, and P is a positive integer greater than or equal to 2 and less than M and is a divisor of M, and i is a positive integer greater than or equal to 1 and less than or equal to P.

In some embodiments, the array substrate further comprises a light-emitting area comprising the plurality of light-emitting units. The plurality of first signal lines are at least arranged between any two adjacent columns of the N columns of light-emitting units, and in the light-emitting area, an orthographic projection of the plurality of first signal lines on the array substrate and an orthographic projection of the plurality of light-emitting units on the array substrate at least partially do not overlap.

In some embodiments, lengths of the P first signal lines are different from each other, and the length of the $(i-1)^{th}$ first signal line among the P first signal lines is greater than the length of the $i^{th}$ first signal line among the P first signal lines, and the $i^{th}$ first signal line among the P first signal lines refers to the $i^{th}$ first signal line along the second direction among the P first signal lines.

In some embodiments, a difference between the length of the $(i-1)^{th}$ first signal line and the length of the $i^{th}$ first signal line among the P first signal lines is equal to a difference between the length of the $i^{th}$ first signal line and the length of the $(i+1)^{th}$ first signal line among the P first signal lines.

In some embodiments, a width of each of the first to $(P-1)^{th}$ first signal lines among the P first signal lines gradually becomes wider in a direction from the $M^{th}$ row of light-emitting units to the first row of light-emitting units, the width refers to the width of each of the first to $(P-1)^{th}$ first signal lines in a direction perpendicular to the extending direction of the first signal line.

In some embodiments, the $i^{th}$ first signal line among the P first signal lines comprises P+1−i segments, and each of the P+1−i segments has a same length but a different width, and any two adjacent segments with different widths of the P+1−i segments are connected by a transition segment. A width of the $(X-1)^{th}$ segment of the $i^{th}$ first signal line is less than a width of the $X^{th}$ segment of the $i^{th}$ first signal line, $1 \leq X \leq P+1-i$.

In some embodiments, the width of the $X^{th}$ segment of the $i^{th}$ first signal line among the P first signal lines is equal to a width of the $X^{th}$ segment of the $(i+1)^{th}$ first signal line among the P first signal lines.

In some embodiments, each of the P first signal lines has a different width and a same resistance, and the width refers to the width of each of the P first signal lines in a direction perpendicular to the extending direction of the first signal line.

In some embodiments, each of the P first signal lines has the same width along the extending direction.

In some embodiments, the array substrate further comprises a plurality of second signal lines extending along the first direction. The plurality of second signal lines are divided into N groups, the N groups of second signal lines are in one-to-one correspondence with the N columns of light-emitting units, and each of the N groups of second signal lines is electrically connected to a column of light-emitting units corresponding to the group of second signal lines. Each group of second signal lines comprises Z second signal lines, and for each column of light-emitting units, the $(j+(M/P)*(k-1))^{th}$ rows of light-emitting units in the column of light-emitting units are all electrically connected to the $j^{th}$ second signal line among the Z second signal lines. Z is equal to M/P, j is a positive integer greater than or equal to 1 and less than or equal to M/P, and k is selected from all positive integers from 1 to P.

In some embodiments, the array substrate further comprises a light-emitting area comprising the plurality of light-emitting units. The plurality of second signal lines are at least arranged between any two adjacent columns of the N columns of light-emitting units, and in the light-emitting area, an orthographic projection of the plurality of second signal lines on the array substrate and an orthographic projection of the plurality of light-emitting units on the array substrate at least partially do not overlap.

In some embodiments, the array substrate further comprises a bonding electrode. The bonding electrode is on a side of the $M^{th}$ row of light-emitting units away from the first row of light-emitting units. The plurality of first signal lines and the plurality of second signal lines comprise bent portions, and the plurality of first signal lines and the plurality of second signal lines are electrically connected to the bonding electrode respectively via the bent portions.

In some embodiments, an orthographic projection of the bent portions of the plurality of first signal lines and the plurality of second signal lines on the array substrate at least overlap with an orthographic projection of the $M^{th}$ row of light-emitting units on the array substrate.

In some embodiments, each of the plurality of light-emitting units comprises a plurality of light-emitting elements, the plurality of light-emitting elements are electrically connected to each other via a third signal line, one end of the third signal line is electrically connected to a corresponding one of the first signal lines, and the other end of the third signal line is electrically connected to a corresponding one of the second signal lines.

In some embodiments, a portion of the third signal line between two adjacent light-emitting elements of the plurality of light-emitting elements comprises a broken line segment.

In some embodiments, a portion of the third signal line between two adjacent light-emitting elements of the plurality of light-emitting elements comprises a straight line segment.

In some embodiments, the array substrate further comprises a substrate. The plurality of first signal lines and the plurality of second signal lines are on the substrate and are in a same layer, the plurality of third signal lines are on a side of the layer where the plurality of first signal lines and the plurality of second signal lines are located away from the substrate. The plurality of first signal lines and the plurality of second signal lines are respectively electrically connected to the plurality of third signal lines via holes.

In some embodiments, the array substrate further comprises: a first insulating layer between a layer where the plurality of third signal lines are located and the layer where the plurality of first signal lines and the plurality of second signal lines are located, and a material of the first insulating layer comprising organic material; a plurality of exhaust holes on a side of the first insulating layer away from the substrate.

In some embodiments, an orthographic projection of the plurality of third signal lines on the array substrate does not overlap with an orthographic projection of the plurality of exhaust holes on the array substrate.

In some embodiments, each of the first signal lines is configured to receive a first signal voltage, each of the second signal lines is configured to receive a second signal voltage, and there is a voltage difference between the first signal voltage and the second signal voltage.

In some embodiments, each of the plurality of light-emitting units comprises at least one sub-millimeter light-emitting diode or micro light-emitting diode.

According to another aspect of the present disclosure, there is provided a backlight comprising the array substrate described in any of the preceding embodiments.

According to yet another aspect of the present disclosure, there is provided a display device comprising the array substrate described in any of the preceding embodiments.

BRIEF DESCRIPTION OF THE DRAWINGS

In order to describe the technical solutions in the embodiments of the present disclosure more clearly, the accompanying drawings required in the embodiments will be briefly introduced below. Obviously, the drawings in the following description are only some embodiments of the present disclosure. For those of ordinary skill in the art, other drawings can also be obtained based on these drawings without any creative effort.

DETAILED DESCRIPTION OF THE DISCLOSURE

The technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those of ordinary skill in the art without creative efforts shall fall within the protection scope of the present disclosure.

In the related art, a light-emitting device comprises a plurality of light-emitting units arranged in an array, and the plurality of light-emitting units are electrically connected to a positive signal line and a negative signal line to emit light. The inventors of the present application have found that, in a conventional light-emitting device, these light-emitting units are driven in a passive matrix manner, and the addressed light-emitting unit is lit for a short time, and the overall emission will have flickering or crosstalk problems. In addition, in order to maintain the overall average brightness, a higher voltage needs to be applied, and the power consumption is higher, thereby seriously affecting the lighting effect of the light-emitting device.

Figure 1:
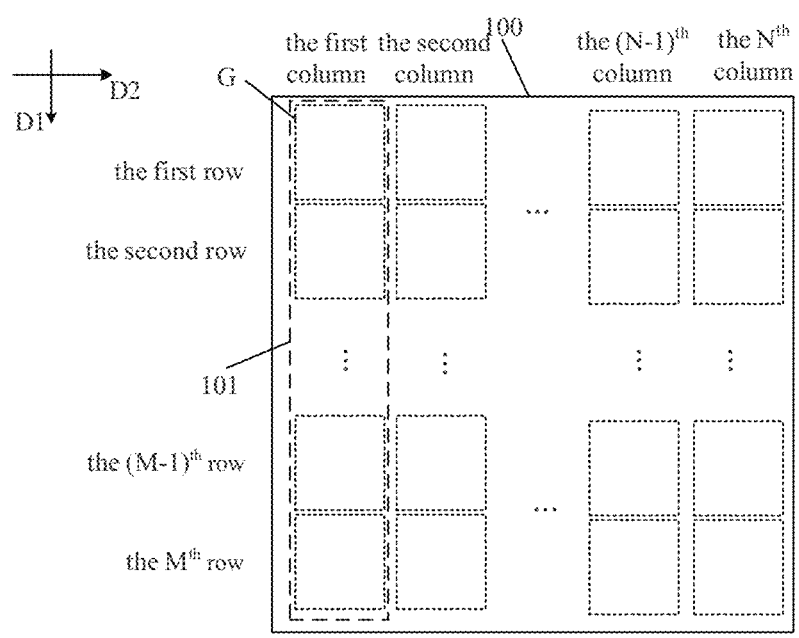
FIG. 1 illustrates a schematic diagram of the arrangement of light-emitting units of an array substrate provided according to an embodiment of the present disclosure.
Figure 2:
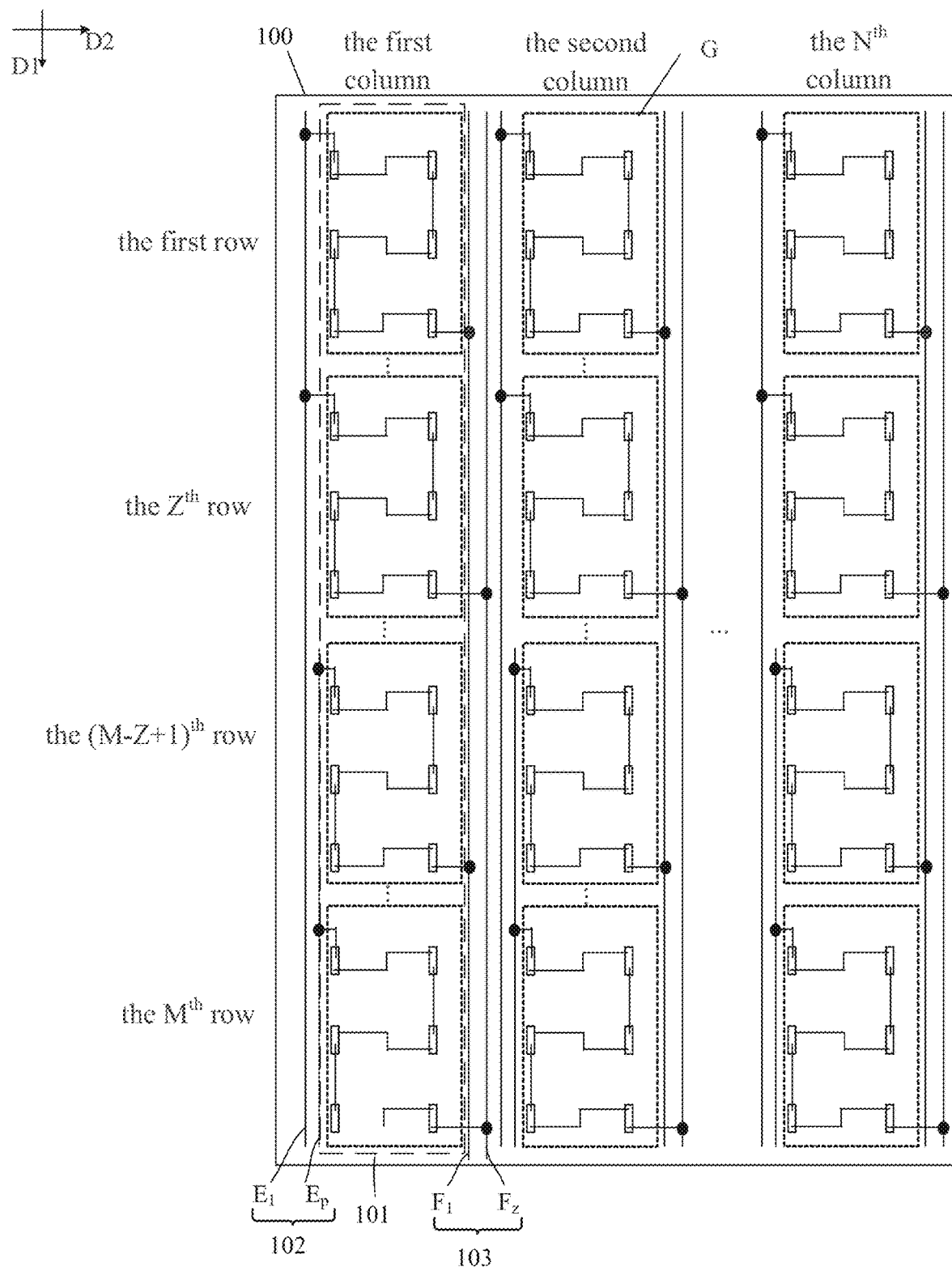
FIG. 2 illustrates a schematic plan view of an array substrate provided according to an embodiment of the present disclosure.

In view of this, an embodiment of the present disclosure provides an array substrate. FIG. 1 simply illustrates a schematic diagram of the arrangement of the array substrate 100 (the elements of the array substrate 100 are omitted), and FIG. 2 illustrates the arrangement of the array substrate 100 in more detail. As illustrated in FIG. 1 and FIG. 2, the array substrate 100 comprises a plurality of light emitting-units G and a plurality of first signal lines E. Each rectangular area in FIG. 1 represents a light-emitting unit G, and the structure illustrated in each dotted rectangle in FIG. 2 is a light-emitting unit G. The plurality of light-emitting units G are arranged in an array, the plurality of light-emitting units G are arranged in M rows along a first direction D1 and arranged in N columns along a second direction D2 intersecting (e.g., perpendicular to) with the first direction D1 to constitute N columns of light-emitting units 101. The plurality of first signal lines E extend along the first direction D1, the plurality of first signal lines E are divided into N groups, and the N groups of first signal lines 102 are in one-to-one correspondence with the N columns of light-emitting units, and each group 102 of the N groups of first signal lines is electrically connected to a column of light-emitting units 101 corresponding to the group of first signal lines 102. Each group of first signal lines 102 comprises at least two first signal lines E, and for each column of light-emitting units 101, at least two consecutive rows of light-emitting units are electrically connected to one of the at least two first signal lines E, and the remaining at least one row of light-emitting unit in the column of light-emitting units 101 except the at least two consecutive rows of light-emitting units is electrically connected to the other one of the at least two first signal lines E. M is a positive integer greater than or equal to 3, and N is a positive integer greater than or equal to 1.

It should be noted that in this application, each light-emitting unit is marked as G, and each column of light-emitting units in the N columns of light-emitting units is marked as 101, for example, the first column of light-emitting units 101, the second column of light-emitting units 101, the third column of light-emitting units 101, and the $N^{th}$ column of light-emitting units 101. As an example, in FIG. 2, the first column of light-emitting units 101 is circled by a rectangular frame with a long dashed line. A column of light-emitting units 101 may comprise a plurality of light-emitting units G. Similarly, each first signal line is marked as E, and each group of first signal lines in the N groups of first signal lines is marked as 102, for example, the first group of first signal lines 102, the second group of first signal lines 102, the third group of first signal lines 102 and the $N^{th}$ group of first signal lines 102. As an example, in FIG. 2, at least two first signal lines E electrically connected to the first column of light-emitting units 101 constitute the first group of first signal lines 102, and at least two first signal lines E electrically connected to the second column of light-emitting units 101 constitute the second group of first signal lines 102, and at least two first signal lines E electrically connected to the $N^{th}$ column of light-emitting units 101 constitute the $N^{th}$ group of first signal lines 102. A group of first signal lines 102 may comprise at least two first signal lines E.

Specifically, the plurality of light-emitting units G are arranged in M rows*N columns, as illustrated in the figure, along the first direction D1, the first row, the second row, the $Z^{th}$ row, the $(M-Z+1)^{th}$ row, the $M^{th}$ row ($2 \leq Z < M$, and $Z=M/P$, the value of P will be described in detail below) are arranged in sequence. Along the second direction D2, the sequence is the first column, the second column, and the $N^{th}$ column. On the same side of each column of light-emitting units 101, a group of first signal lines 102 corresponding to the column of light-emitting units 101 is arranged, and the group of first signal lines 102 is electrically connected to the column of light-emitting units 101, so that the wiring space between the two adjacent columns of light-emitting units 101 is basically the same, and the arrangement of the plurality of light-emitting units G is more uniform. For example, the first group of first signal lines 102 is arranged on the left side of the first column of light-emitting units 101, the second group of first signal lines 102 is arranged on the left side of the second column of light-emitting units 101, and so on, the $N^{th}$ group of first signal lines 102 is arranged on the left side of the $N^{th}$ column of light-emitting units 101. FIG. 2 illustrates that each group of first signal lines 102 comprises P first signal lines E. Taking the first column of light-emitting units 101 as an example, the first row to the $Z^{th}$ row of light-emitting units in the first column of light-emitting units 101 are all electrically connected to the first signal line $E_1$, and the $(M-Z+1)^{th}$ row to the M row of light-emitting units in the first column of light-emitting units 101 are all electrically connected to the first signal line $E_P$. The connection manner between each of the remaining columns of light-emitting units 101 and the first signal lines E is the same as the connection manner between the first column of light-emitting units 101 and the first signal lines E. In an example, M=4, Z=2, then the first row to the second row of light-emitting units in each column of light-emitting units 101 in FIG. 2 are all electrically connected to the first signal line $E_1$, and the third row to the fourth row of light-emitting units in each column of light-emitting units 101 are electrically connected to the first signal line $E_2$.

It should be noted that the term "array substrate" refers to a substrate on which components or structures are arranged in an array. In the embodiments of the present disclosure, the plurality of light-emitting units G on the array substrate 100 are arranged in an array, and are arranged in M rows*N columns.

In the array substrate 100 provided by the embodiments of the present disclosure, a column of light-emitting units 101 corresponds to a group of first signal lines 102, and at least one first signal line E in each group of first signal lines 102 is electrically connected to at least two consecutive rows of light-emitting units in a column of light-emitting units 101, the other first signal line E in each group of first signal lines 102 is electrically connected to the remaining at least one row of light-emitting unit in the column of light-emitting units 101, that is, a column of light-emitting units 101 is controlled by at least two first signal lines E. Compared with controlling one column of light-emitting units 101 by one first signal line E, controlling one column of light-emitting units 101 by at least two first signal lines E can achieve better partition control for the plurality of light-emitting units G arranged in an array, thereby improving the light-emitting effect of the array substrate 100. Meanwhile, compared with each light-emitting unit G being connected to one first signal line E, a plurality of light-emitting units G in each column of light-emitting units 101 of the array substrate 100 are commonly connected to the same first signal line E, multiplexing of the first signal lines E is achieved, so that the required number of the first signal lines E can be reduced. In this way, on the one hand, electrical materials and costs can be saved; on the other hand, the area occupied by the first signal lines E can be reduced, thereby facilitating the realization of a narrow frame.

In some embodiments, each group of first signal lines 102 comprises P first signal lines E, the first signal line $E_i$ among the P first signal lines E is electrically connected to the $(1+(M/P)*(i-1))^{th}$ row to the $((M/P)*i)^{th}$ row of light-emitting units in a column of light-emitting units 101, P is a positive integer greater than or equal to 2 and less than M and is a divisor of M, i is a positive integer greater than or equal to 1 and less than or equal to P. It should be noted that the first signal line $E_i$ here refers to the $i^{th}$ first signal line along the second direction D2 in the group of first signal lines 102. For example, the first signal line $E_3$ refers to the third first signal line along the second direction D2 in the group of first signal lines 102. The number of rows of light-emitting units in the same column of light-emitting units 101 to which each first signal line in each group is connected is the same.

Figure 3:
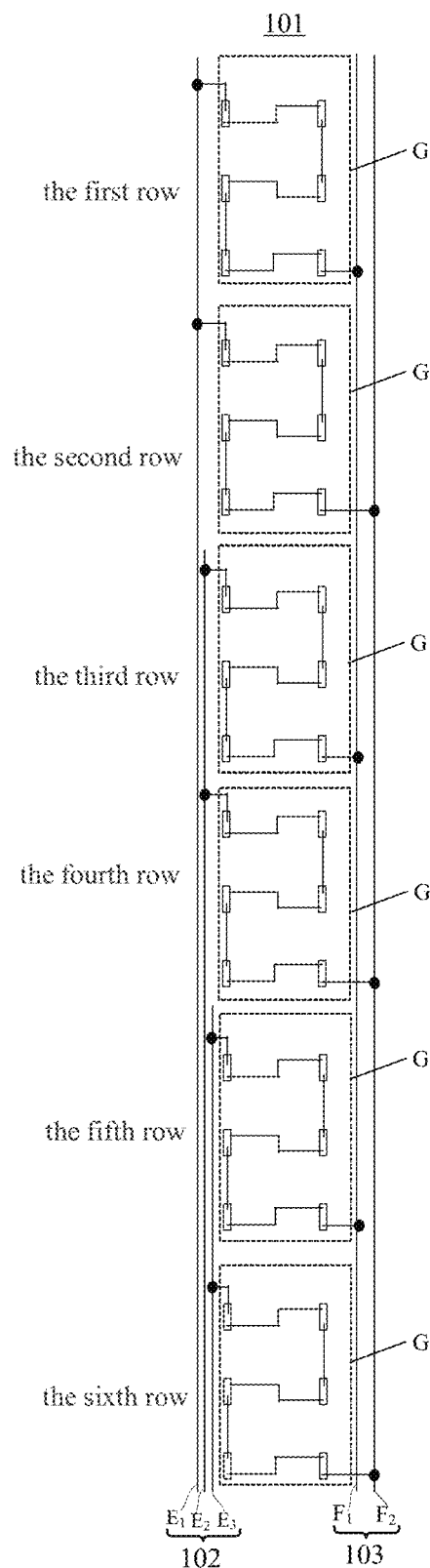
FIG. 3 illustrates another schematic plan view of an array substrate provided according to an embodiment of the present disclosure.

The first signal line $E_i$ in each group of first signal lines 102 is electrically connected to the $(1+(M/P)*(i-1))^{th}$ row to the $((M/P)*i)^{th}$ row of light-emitting units in one column of light-emitting units 101. For example, in an example, when M=4 and P=2, the first signal line $E_1$ is electrically connected to the $1^{th}$-$2^{th}$ rows of light-emitting units in a column of light-emitting units 101, and the first signal line $E_2$ is electrically connected to the $3^{th}$-$4^{th}$ rows of light-emitting units in a column of light-emitting units 101. In another example, when M=6 and P=3, as illustrated in FIG. 3, the first signal line $E_1$ is electrically connected to the $1^{th}$-$2^{th}$ rows of light-emitting units in a column of light-emitting units 101, the first signal line $E_2$ is electrically connected to the $3^{th}$-$4^{th}$ rows of light-emitting units in a column of light-emitting units 101, and the first signal line $E_3$ is electrically connected to the $5^{th}$-$6^{th}$ rows of light-emitting units in a column of light-emitting units 101. In yet another example, when M=32 and P=8, the first signal line $E_1$ is electrically connected to the $1^{th}$-$4^{th}$ rows of light-emitting units in a column of light-emitting units 101, the first signal line $E_2$ is electrically connected to the $5^{th}$-$8^{th}$ rows of light-emitting units in a column of light-emitting units 101, the first signal line $E_3$ is electrically connected to the $9^{th}$-$12^{th}$ rows of light-emitting units in a column of light-emitting units 101, the first signal line $E_4$ is electrically connected to the $13^{th}$-$16^{th}$ rows of light-emitting units in a column of light-emitting units 101, the first signal line $E_7$ is electrically connected to the $17^{th}$-$20^{th}$ rows of light-emitting units in a column of light-emitting units 101, the first signal line $E_6$ is electrically connected to the $21^{th}$-$24^{th}$ rows of light-emitting units in a column of light-emitting units 101, the first signal line $E_7$ is electrically connected to the $25^{th}$-$28^{th}$ rows of light-emitting units in a column of light-emitting units 101, and the first signal line $E_8$ is electrically connected to the $29^{th}$-$32^{th}$ rows of light-emitting units in a column of light-emitting units 101.

By controlling a column of light-emitting units 101 by a plurality of first signal lines E, better partition control of the plurality of light-emitting units G arranged in an array can be achieved, thereby further improving the light-emitting effect of the array substrate 100. And compared with the need to configure M first signal lines E for one column of light-emitting units 101, only P (P<M) first signal lines E need to be configured for one column of light-emitting units 101 of the array substrate 100, thereby reducing the need for the number of the first signal lines E. In this way, on the one hand, electrical materials and costs can be saved; on the other hand, the area occupied by the first signal lines E can be reduced, thereby facilitating the realization of a narrow frame.

As illustrated in FIG. 2, a corresponding group of first signal lines 102 are arranged between any two adjacent columns of light-emitting units 101 in the N columns of light-emitting units. For example, a group of first signal lines 102 electrically connected to the second column of light-emitting units 101 is arranged between the first column of light-emitting units 101 and the second column of light-emitting units 101, a group of first signal lines 102 electrically connected to the third column of light-emitting units 101 is arranged between the second column of light-emitting units 101 and the third column of light-emitting units 101, and a group of first signal lines 102 electrically connected to the $N^{th}$ column of light-emitting units 101 is arranged between the $(N-1)^{th}$ column of light-emitting units 101 and the $N^{th}$ column of light-emitting units 101. Within the light-emitting area occupied by the plurality of light emitting units G, the orthographic projection of all the first signal lines E on the array substrate 100 at least partially do not overlap with the orthographic projection of the plurality of light-emitting units G on the array substrate 100. In an example, within the light-emitting area occupied by the plurality of light-emitting units G, the orthographic projection of all the first signal lines E on the array substrate 100 do not overlap with the orthographic projection of the plurality of light-emitting units G on the array substrate 100, that is, all the first signal lines E are arranged on the periphery of each light-emitting unit G, and have an appropriate distance from the light-emitting unit G. With such arrangement, the overlap between the first signal lines E and each light-emitting element in each light-emitting unit G and the overlap between the first signal lines E and the connection lines connecting the light-emitting elements are avoided, so that the crosstalk of the signal voltage on each first signal line E to the light-emitting unit G that is not electrically connected to the first signal lines E can be reduced.

Continuing to refer to FIG. 2, it can be seen that the lengths of the first signal lines E in each group of first signal lines 102 are different, and the length of the first signal line $E_1$ is greater than the length of the first signal line $E_2$. The "length" here refers to the length of the first signal line E along the first direction D1. When each group comprises P first signal lines E, the length of the first signal line $E_{i-1}$ is greater than the length of the first signal line $E_i$. That is, in each group of first signal lines 102, the first signal line $E_1$ with the longest length is located on the side farthest from a column of light-emitting units 101 electrically connected to the group of first signal lines 102 in the second direction D2. The first signal line $E_P$ with the shortest length is located on the side closest to a column of light-emitting units 101 electrically connected to the group of first signal lines 102 in the second direction D2. The first signal line $E_1$ drives the first row of light-emitting unit to the $(M/P)^{th}$ row of light-emitting unit in the same column of light-emitting units 101, and the first signal line $E_P$ drives the $(M-M/P+1)^{th}$ row of light-emitting unit to the $M^{th}$ row of light-emitting unit in the same column of light-emitting units 101. In an example, the difference between the length of the first signal line $E_{i-1}$ and the length of the first signal line $E_i$ in each group is equal to the difference between the length of the first signal line $E_i$ and the length of the first signal line $E_{i-1}$. That is to say, the length of each first signal line E in each group of first signal lines 102 constitutes an arithmetic progression. For example, the length of the first signal line $E_P$ can be roughly considered to be equal to the length of the M/P rows of light-emitting units along the first direction D1, the length of the first signal line $E_{p-1}$ can be roughly considered to be equal to the length of the 2*(M/P) rows of light-emitting units along the first direction D1; the length of the first signal line $E_2$ can be roughly considered to be equal to the length of the (P-1)*(M/P) rows of light-emitting units along the first direction D1, and the length of the first signal line $E_1$ can be roughly considered to be equal to the length of the P*(M/P) rows (that is, M rows) of light-emitting units along the first direction D1.

The inventor(s) of the present application found that, in the related art, the first signal lines with different lengths in each group of first signal lines usually have the same width, and each first signal line has the same size in all widths in the direction perpendicular to its extending direction. Assuming that the length of the first signal line $E_p$ in each group of first signal lines is L, the length of the first signal line $E_1$ in the group of first signal lines can be roughly regarded as P*L. In the case where the widths of the first signal lines in the direction perpendicular to their extending directions have the same size, it can be concluded that the resistance value of the first signal line $E_1$ is P times the resistance value of the first signal line $E_p$. Therefore, when the same voltage is applied to each of the first signal lines, the voltage drop on the first signal line $E_1$ is about P times the voltage drop on the first signal line $E_p$, which seriously affects the uniformity of brightness of the array substrate. Therefore, the display device comprising the array substrate exhibits poor display effect.

In order to overcome the above problems existing in the related art, in the array substrate 100 provided by some embodiments of the present disclosure, the length of each first signal line E in each group of first signal lines 102 is the same as that in the related art (i.e., the length of each first signal line E in each group of first signal lines 102 constitutes an arithmetic progression), but the width of each first signal line E in each group of first signal lines 102 in the direction perpendicular to its extending direction is different. For example, along the extending direction of each first signal line E, the size of the width of each first signal line E in the direction perpendicular to its extending direction gradually becomes larger (except for the first signal line $E_p$). The specific arrangement of the first signal lines E may be as follows: in each group of first signal lines 102, the distance occupied by the first signal line $E_1$ to the first signal line $E_P$ in the second direction D2 is denoted as W, and the interval between any two adjacent first signal lines E is denoted as S. It should be noted that "S" here is a fixed value, that is, no matter how the size of the width of each of the two adjacent first signal lines E in the direction perpendicular to its extending direction changes, the interval between the two adjacent first signal lines E is always S. As illustrated in FIG. 2, taking the first group of first signal lines 102 electrically connected to the first column of light-emitting units 101 as an example, there are P first signal lines (i.e., $E_1$~$E_p$) in total on the side of light-emitting units from the $(M-M/P+1)^{th}$ row to the $M^{th}$ row in the first column of light-emitting units 101, and within this space, the width of each of the P first signal lines is (W-(P-1)*S)/P. There are only P-1 first signal lines (i.e., $E_1$~$E_{p-1}$) in total on the side of light-emitting units from the $(M-2*M/P+1)^{th}$ row to the $(M-M/P)^{th}$ row in the first column of light-emitting units 101, and within this space, the width of each of the P-1 first signal lines increases to (W-(P-2)*S)/(P-1). And so on, there are only two first signal lines (i.e., $E_1$~$E_2$) on the side of light-emitting units from the $(M/P+1)^{th}$ row to the $(2*M/P)^{th}$ row in the first column of light-emitting units 101, and within this space, the width of each of the two first signal lines increases to (W-S)/2. There is only one first signal line (i.e., $E_1$) on the side of light-emitting units from the first row to the $(M/P)^{th}$ row in the first column of light-emitting units 101, and within this space, the width of the first signal line $E_1$ increases to W. Therefore, for each first signal line E in each group of first signal lines 102, when there are first signal lines $E_1$ to $E_i$ in a certain space, the first signal lines $E_1$ to $E_i$ have the same width in the space. Specifically, for each first signal line E in each group of first signal lines 102, the width of each first signal line E gradually increases along its extending direction.

In other words, in each group of first signal lines 102, taking the first group of first signal lines 102 electrically connected to the first column of light-emitting units 101 as an example, the first signal line $E_1$ is equally divided into P segments in length. The segment of the first signal line $E_1$ corresponding to the $(M-M/P+1)^{th}$ row of light-emitting unit to the $M^{th}$ row of light-emitting unit in the first column of light-emitting units 101 is denoted as the first segment; the segment of the first signal line $E_1$ corresponding to the $(M-2*M/P+1)^{th}$ row of light-emitting unit to the $(M-M/P)^{th}$ row of light-emitting unit in the first column of light-emitting units 101 is denoted as the second segment; and so on, the segment of the first signal line $E_1$ corresponding to the first row of light-emitting unit to the $(M/P)^{th}$ row of light-emitting unit in the first column of light-emitting units 101 is denoted as the $P^{th}$ segment. The width of each segment is different. Along the direction from the $M^{th}$ row of light-emitting unit to the first row of light-emitting unit, as the number of the segment increases, the width of the segment gradually increases. That is, the width of the second segment is greater than the width of the first segment, the width of the third segment is greater than the width of the second segment, and so on, the width of the $P^{th}$ segment is greater than the width of the $(P-1)^{th}$ segment. Similarly, the first signal line $E_2$ is equally divided into P-1 segments in length. The segment of the first signal line $E_2$ corresponding to the $(M-M/P+1)^{th}$ row of light-emitting unit to the $M^{th}$ row of light-emitting unit in the first column of light-emitting units 101 is denoted as the first segment. The segment of the first signal line $E_2$ corresponding to the $(M-2*M/P+1)^{th}$ row of light-emitting unit to the $(M-M/P)^{th}$ row of light-emitting unit in the first column of light-emitting units 101 is denoted as the second segment. And so on, the segment of the first signal line $E_2$ corresponding to the $(M/P+1)^{th}$ row of light-emitting unit to the $(2*M/P)^{th}$ row of light-emitting unit in the first column of light-emitting units 101 is denoted as the $(P-1)^{th}$ segment. Along the direction from the $M^{th}$ row of light-emitting unit to the first row of light-emitting unit, as the number of the segment increases, the width of the segment gradually increases. The first signal line $E_{P-1}$ is equally divided into two segments in length. The segment of the first signal line $E_{P-1}$ corresponding to the $(M-M/P+1)^{th}$ row of light-emitting unit to the $M^{th}$ row of light-emitting unit in the first column of light-emitting units 101 is denoted as the first segment. The segment of the first signal line $E_{P-1}$ corresponding to the $(M/P+1)^{th}$ row of light-emitting unit to the $(2*M/P)^{th}$ row of light-emitting unit in the first column of light-emitting units 101 is denoted as the second segment. The width of the second segment is greater than the width of the first segment. The first signal line $E_P$ comprises only one segment, and the segment corresponds to the $(M-M/P+1)^{th}$ row of light-emitting unit to the $M^{th}$ row of light-emitting unit in the first column of light-emitting units 101. That is to say, the first signal line $E_i$ in each group of first signal lines 102 are equally divided into $(P+1-i)$ segments in length, and the width of the $(X-1)^{th}$ segment of the first signal line $E_i$ is smaller than the width of the $X^{th}$ segment of the first signal line $E_i$, $1 \le X \le P+1-i$. It can be seen that the upper limit of the value of X is related to the value of i. For example, when i is 1, the maximum value of X is P, that is, the widest segment of the first signal line $E_1$ is the $P^{th}$ segment; when i is 2, the maximum value of X is P-1, that is, the widest segment of the first signal line $E_2$ is the $(P-1)^{th}$ segment, and so on. The first segments of the first signal line $E_1$ to the first signal line $E_p$ have the same length and width; the first segments of the first signal line $E_1$ to the first signal line $E_{p-1}$ have the same length and width, and the second segments of the first signal line $E_1$ to the first signal line $E_{p-1}$ have the same length and width, but the width of their second segment is wider than the width of their first segment. By analogy, the first segments of the first signal line $E_1$ to the first signal line $E_2$ have the same length and width, the second segments of the first signal line $E_1$ to the first signal line $E_2$ have the same length and width, the $(P-2)^{th}$ segments of the first signal line $E_1$ to the first signal line $E_2$ have the same length and width, and the $(P-1)^{th}$ segments of the first signal line $E_1$ to the first signal line $E_2$ have the same length and width, but the width of $(P-1)^{th}$ segment is wider than the width of the $(P-2)^{th}$ segment, and the width of the $(P-2)^{th}$ segment is wider than the width of the $(P-3)^{th}$ segment, so the width of the second segment is wider than the width of the first segment. That is to say, the width of the $X^{th}$ segment of the first signal line $E_i$ among the P first signal lines is equal to the width of the $X^{th}$ segment of the first signal line $E_{i+1}$ among the P first signal lines, and the width of the $(X+1)^{th}$ segment of the first line $E_i$ is equal to the width of the $(X+1)^{th}$ segment of the first signal line $E_{i+1}$. However, the width of the $(X+1)^{th}$ segment is wider than the width of the $X^{th}$ segment.

Figure 4A:
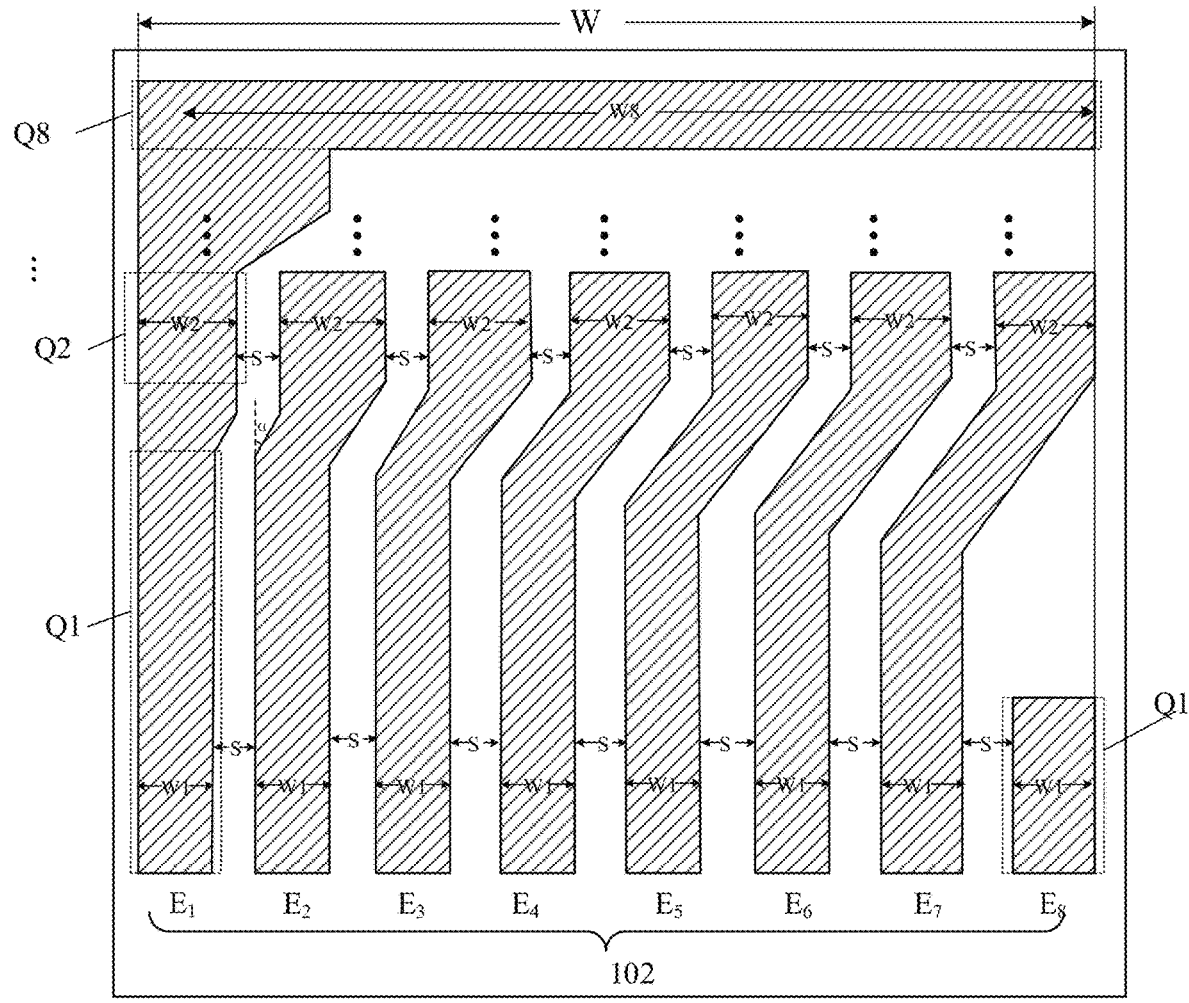
FIG. 4A illustrates a schematic diagram of the arrangement of the first signal lines provided according to an embodiment of the present disclosure.

FIG. 4A illustrates an example of the width design of each first signal line E in a group of first signal lines 102. In this example, the plurality of light-emitting units G arranged in an array are arranged in 32 rows, and each group of first signal lines 102 comprises 8 first signal lines, i.e., M=32, P=8. It should be noted that FIG. 4A only illustrates a part of the first signal line $E_1$ to the first signal line $E_8$, for example, only the first segment Q1 with width W1 and the second segment Q2 with width W2 of the first signal line $E_2$ to the first signal line $E_8$ are illustrated, and only the first segment Q1 with width W1, the second segment Q2 with width W2 and the eighth segment Q8 with width W8 of the first signal line $E_1$ are shown, other segments in the middle are omitted. The total distance occupied by the eight first signal lines in each group of first signal lines 102 in the second direction D2 is W=1500 µm, and the interval between any two adjacent first signal lines 102 is S=100 µm. It can be obtained through calculation that the width of the first segment Q1 from the first signal line $E_1$ to the first signal line $E_p$ is W1=(W−(P−1)*S)/P=(1500−(8−1)*100)/8=100 µm. The width of the second segment Q2 from the first signal line $E_1$ to the first signal line $E_{p-1}$ is W2=(W−(P−2)*S)/(P−1)=(1500−(8−2)*100)/(8−1)≈128.5 µm, and so on. For the first signal line $E_1$, it has different widths at different positions, specifically, the first signal line $E_1$ can be divided into 8 segments Q1, Q2, Q3, Q4, Q5, Q6, Q7, Q8 with different widths. The width of the first signal line $E_1$ in each segment is unchanged, and the widths of these 8 segments are W1, W2, W3, W4, W5, W6, W7, W8 respectively. It can be understood that, for each first signal line E, a plurality of transition segments are also comprised, and the transition segments are used to connect two adjacent segments with different widths. For example, there is a transition segment with a gradually changing width between the first segment Q1 and the second segment Q2 of the first signal line $E_1$, a transition segment is similarly comprised between other two adjacent segments of the first signal line $E_1$. FIG. 4A only illustrates the first segment Q1 with width W1, the second segment Q2 with width W2, and the eighth segment Q8 with width W8 of the first signal line $E_1$, and the third segment with width W3, the fourth segment with width W4, the fifth segment with width W5, the sixth segment with width W6, and the seventh segment with width W7 of the middle segments are omitted. Under the condition that the interval S between two adjacent first signal lines E remains unchanged, the width of each segment of each first signal line E can be obtained according to the following formulas:

$$W1 = (W - (P-1)*S)/P = (1500 - (8-1)*100)/8 = 100 \text{ µm},$$

$$W2 = (W - (P-2)*S)/(P-1) = (1500 - (8-2)*100)/(8-1) \approx 128.5 \text{ µm},$$

$$W3 = (W - (P-3)*S)/(P-2) = (1500 - (8-3)*100)/(8-2) \approx 166.6 \text{ µm},$$

$$W4 = (W - (P-4)*S)/(P-3) = (1500 - (8-4)*100)/(8-3) = 220 \text{ µm},$$

$$W5 = (W - (P-5)*S)/(P-4) = (1500 - (8-5)*100)/(8-4) = 300 \text{ µm},$$

$$W6 = (W - (P-6)*S)/(P-5) = (1500 - (8-6)*100)/(8-5) \approx 433.3 \text{ µm},$$

$$W7 = (W - (P-7)*S)/(P-6) = (1500 - (8-7)*100)/(8-6) = 700 \text{ µm},$$

$$W8 = (W - (P-8)*S)/(P-7) = (1500 - (8-8)*100)/(8-7) = 1500 \text{ µm}.$$

If the signal line design in the related art is adopted, that is, each first signal line E has the same width in its extending direction, it is assumed that in a group of first signal lines 102, the resistance of the first signal line $E_p$ is R, since the extension length of the first signal line $E_1$ is greater than that of the first signal line $E_p$, the length of the first signal line $E_1$ is about 8 times the length of the first signal line $E_p$, the resistance of the first signal line $E_1$ is greater than the resistance of the first signal line $E_P$ (i.e., about 8R). However, in the embodiments of the present disclosure, the width of each first signal line E gradually becomes wider along its extending direction. It is obtained through calculation that in a group of first signal lines 102, when the resistance of the first signal line $E_p$ is R, the resistance of the first signal line $E_1$ is 3.6 R. It can be seen that by gradually widening the width of each first signal line E along its extending direction, the resistance difference between the first signal lines E with different lengths can be significantly reduced, thus, the difference in voltage drop between the first signal lines E can be significantly reduced. Therefore, the brightness uniformity of the array substrate 100 can be significantly improved, so that the display device comprising the array substrate 100 has a better display effect.

As illustrated in FIG. 4A, one side of the first signal line $E_1$ away from the column of light emitting units is a straight segment parallel to the first direction D1, and the transition segment in the other side is an oblique line segment having an angle α with the first direction D1. Since the interval S between the two adjacent first signal lines E remains unchanged, regarding the two sides of each transition segment of other first signal lines except the first signal line E1, the side closer to the first signal line $E_1$ is a broken line segment, and the other side is an oblique line segment having an angle with the first direction D1. The broken line segment comprises at least one first sub-line segment parallel to the first direction D1 and one second sub-line segment having an angle α with the first direction D1. In this embodiment, compared with the related art, the resistance difference between first signal lines E can be significantly reduced, and the uniformity of electrical performance of each first signal line is better.

Figure 4B:
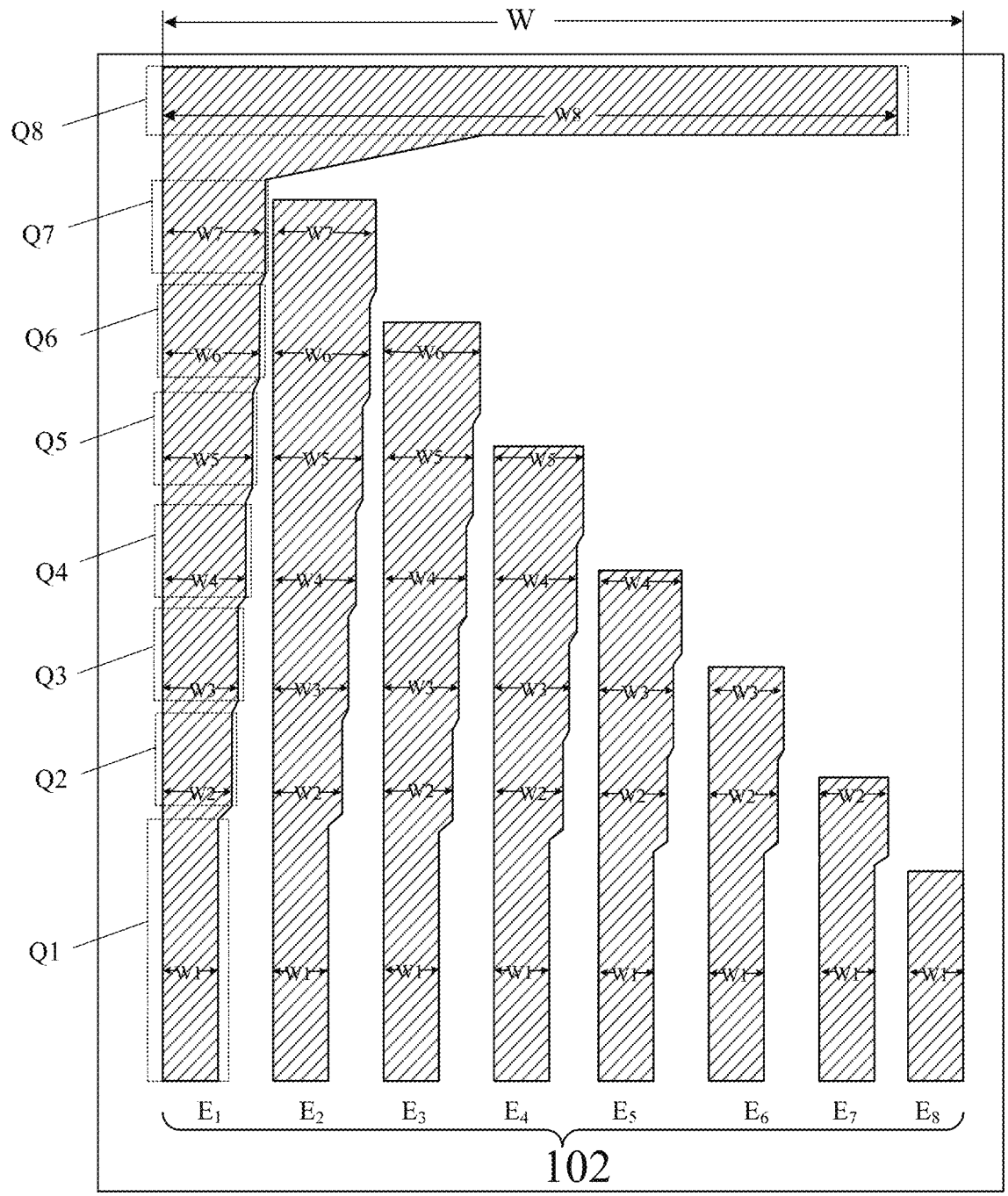
FIG. 4B illustrates another schematic diagram of the arrangement of the first signal lines provided according to an embodiment of the present disclosure.

FIG. 4B illustrates another example of the width design of each first signal line E in a group of first signal lines 102. In this example, the plurality of light-emitting units G arranged in an array are also arranged in 32 rows, and each group of first signal lines 102 also comprises 8 first signal lines, i.e., M=32, P=8. The first signal line $E_1$ has 8 segments with different widths, namely a first segment Q1 with a width W1, a second segment Q2 with a width W2, a third segment Q3 with a width W3, a fourth segment Q4 with a width W4, a fifth segment Q5 with a width W5, a sixth segment Q6 with a width W6, a seventh segment Q7 with a width W7 and a eighth segment Q8 with a width W8. The values of W1 to W8 in FIG. 4B are respectively equal to the values of W1 to W8 in FIG. 4A. Similarly, the first signal line $E_2$ has 7 segments with different widths, namely a first segment Q1 with a width W1, a second segment Q2 with a width W2, a third segment Q3 with a width W3, a fourth segment Q4 with a width W4, a fifth segment Q5 with a width W5, a sixth segment Q6 with a width W6, and a seventh segment Q7 with a width W7. The first signal line $E_7$ has two segments with different widths, namely a first segment Q1 with a width W1 and a second segment Q2 with a width W2. The first signal line $E_8$ has a first segment Q1 with a width W1. The difference from FIG. 4A is that in FIG. 4B, one side of each first signal line E along its extending direction is a straight segment, and the other side along its extending direction is composed of broken line segments. By bending the other side at different positions, the first signal line E having a plurality of segments with different widths is realized, and the width of the first signal line $E_1$ within each segment is unchanged. It can be understood that, for each first signal line E, it also comprises a plurality of transition segments, the transition segment is used to connect two adjacent segments with different widths. One side of the transition segment is a straight segment parallel to the first direction D1, and the other side is an oblique line segment having an angle with the first direction D1.

Comparing FIG. 4A with FIG. 4B, it can be seen that the intervals between two adjacent first signal lines E at different positions in FIG. 4B are different. That is, the interval between the first segments Q1 with the width W1 in the two adjacent first signal lines is greater than the interval between the first segments Q2 with the width W2 in the two adjacent first signal lines. In this embodiment, the resistance difference between the first signal lines E can be reduced, and the design complexity can be reduced.

Figure 5:
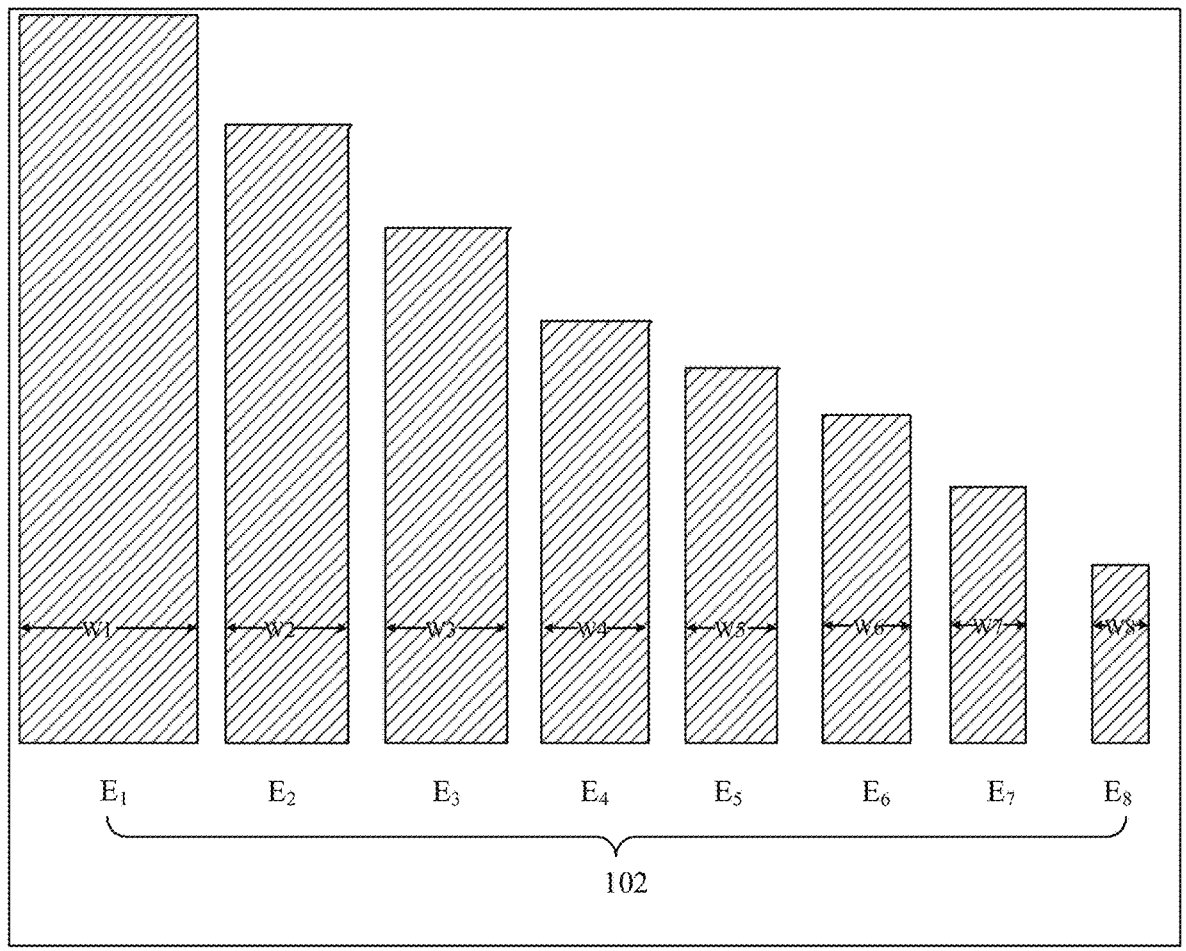
FIG. 5 illustrates yet another schematic diagram of the arrangement of the first signal lines provided according to an embodiment of the present disclosure.

In order to reduce or even avoid the resistance difference (and thus the voltage drop difference) between the first signal lines E, other embodiments of the present application disclose the following solutions. As illustrated in FIG. 5, the length of each first signal line E in each group of first signal lines 102 still constitutes an arithmetic progression (the length of the first signal line $E_1$ is the longest, and the length of the first signal line $E_p$ is the shortest). However, by rationally designing the widths of the first signal lines E with different lengths in each group of first signal lines 102, the first signal lines E have the same resistance. Since each of the first signal lines has the same resistance, the voltage drop on each of the first signal lines is also the same. In FIG. 5, taking each group of first signal lines 102 comprising eight first signal lines E as an example, the width W1 of the first signal line $E_1$ is wider than the width W2 of the first signal line $E_2$, the width W2 of the first signal line $E_2$ is wider than the width W3 of the first signal line $E_3$, the width W3 of the first signal line $E_3$ is wider than the width W4 of the first signal line $E_4$, the width W4 of the first signal line $E_4$ is wider than the width W5 of the first signal line $E_5$, the width W5 of the first signal line $E_5$ is wider than the width W6 of the first signal line $E_6$, the width W6 of the first signal line $E_6$ is wider than the width W7 of the first signal line $E_7$, and the width W7 of the first signal line $E_7$ is wider than the width W8 of the first signal line $E_8$. In an example, 1/W8=2/W7=3/W6=4/W5=5/W4=6/W3=7/W2=8/W1. Specifically for each first signal line E, each first signal line E has the same width everywhere in the direction perpendicular to its extending direction (i.e., the first direction D1).

By making the resistance of the first signal lines E in each group of first signal lines 102 equal to each other, when a voltage signal is applied to each first signal line E in each group of first signal lines 102, the voltage drop of each first signal line E is the same, so that each light-emitting unit G on the array substrate 100 can maintain the same brightness, the array substrate 100 has a very uniform brightness, and the display device comprising the array substrate 100 has excellent display effect.

Referring to FIG. 2, the array substrate 100 further comprises a plurality of second signal lines F extending along the first direction D1. The plurality of second signal lines F are divided into N groups, and one group of second signal lines 103 in the N groups of second signal lines is electrically connected to one column of light-emitting units 101 in the N columns of light-emitting units. Specifically, a group of second signal lines 103 electrically connected to each column of light-emitting units 101 is provided on one side of the column of light-emitting units 101. Each group of second signal lines 103 comprises Z second signal lines F, the $j^{th}$ second signal line in the Z second signal lines F is electrically connected to the $(j+(M/P)*(k-1))^{th}$ rows of light-emitting units in a column of light-emitting units 101, Z is equal to M/P, j is a positive integer greater than or equal to 1 and less than or equal to M/P, and k is selected from all positive integers from 1 to P. It should be noted that the second signal line $F_j$ here refers to the $j^{th}$ second signal line along the second direction D2 in the group of second signal lines 103. For example, the second signal line $F_1$ refers to the second signal line that is the first signal line along the second direction D2 in the group of second signal lines 103, and the second signal line $F_z$ refers to the second signal line that is the $Z^{th}$ signal line along the second direction D2 in the group of second signal lines 103.

It should be noted that, in this application, each second signal line is marked as F, and each group of second signal lines in the N groups of second signal lines is marked as 103, for example, the first group of second signal lines 103, the second group of second signal lines 103, the third group of second signal lines 103, and the $N^{th}$ group of second signal lines 103. As an example, in FIG. 2, a group of second signal lines electrically connected to the first column of light-emitting units 101 may be the first group of second signal lines 103, a group of second signal lines electrically connected to the second column of light-emitting units 101 may be the second group of second signal lines 103, a group of second signal lines electrically connected to the $N^{th}$ column of light-emitting units 101 may be the $N^{th}$ group of second signal lines 103. A group of second signal lines 103 comprises Z second signal lines F.

The second signal lines F and the first signal lines E cooperate with each other, so that the brightness of each light-emitting unit G can be controlled independently. The first signal lines E may be used to receive a first signal voltage, the second signal lines F may be used to receive a second signal voltage, and there is a voltage difference between the first signal voltage and the second signal voltage. In an example, the first signal voltage is a positive voltage and the second signal voltage is a negative voltage. In an alternative example, the first signal voltage is a positive voltage and the second signal voltage is a ground voltage (i.e., a voltage of zero volts).

Taking M=32 and P=8 as an example, to describe how the first signal lines E and the second signal lines F can control the brightness of each light-emitting unit G individually. Taking the first column of light-emitting units 101 as an example, as described above, the first signal line $E_1$ is electrically connected to the $1^{st}$-$4^{th}$ rows of light-emitting units in the column of light-emitting units 101, the first signal line $E_2$ is electrically connected to the $5^{th}$-$8^{th}$ rows of light-emitting units in the column of light-emitting units 101, the first signal line $E_3$ is electrically connected to the $9^{th}$-$12^{th}$ rows of light-emitting units in the column of light-emitting units 101, the first signal line $E_4$ is electrically connected to the $13^{th}$-$16^{th}$ rows of light-emitting units in the column of light-emitting units 101, the first signal line $E_5$ is electrically connected to the $17^{th}$-$20^{th}$ rows of light-emitting units in the column of light-emitting units 101, the first signal line $E_6$ is electrically connected to the $21^{th}$-$24^{th}$ rows of light-emitting units in the column of light-emitting units 101, the first signal line $E_7$ is electrically connected to the $25^{th}$-$28^{th}$ rows of light-emitting units in the column of light-emitting units 101, and the first signal line $E_8$ is electrically connected to the $29^{th}$-$32^{th}$ rows of light-emitting units in the column of light-emitting units 101. When M=32 and P=8, Z=M/P=4; j=1, 2, 3, 4; k=1, 2, 3, 4, 5, 6, 7, 8. The second signal line $F_1$ (i.e., j=1) in each group of second signal lines 103 is electrically connected to the $(1+(M/P)*(k-1))^{th}$ rows of light-emitting units in the first column of light-emitting units 101, substituting the values of M, P, and k into this formula, it can be obtained that the second signal line $F_1$ is electrically connected to the $1^{st}$, $5^{th}$, $9^{th}$, $13^{th}$, $17^{th}$, $21^{st}$, $25^{th}$, and $29^{th}$ rows of light-emitting units in the first column of light-emitting units 101. The second signal line $F_2$ (i.e., j=2) in each group of second signal lines 103 is electrically connected to the $(2+(M/P)*(k-1))^{th}$ rows of light-emitting units in the first column of light-emitting units 101, substituting the values of M, P, and k into this formula, it can be obtained that the second signal line $F_2$ is electrically connected to the $2^{nd}$, $6^{th}$, $10^{th}$, $14^{th}$, $18^{th}$, $22^{nd}$, $26^{th}$, and $30^{th}$ rows of light-emitting units in the first column of light-emitting units 101. The second signal line $F_3$ (i.e., j=3) in each group of second signal lines 103 is electrically connected to the $(3+(M/P)*(k-1))^{th}$ rows of light-emitting units in the first column of light-emitting units 101, substituting the values of M, P, and k into this formula, it can be obtained that the second signal line $F_3$ is electrically connected to the $3^{rd}$, $7^{th}$, $11^{th}$, $15^{th}$, $19^{th}$, $23^{rd}$, $27^{th}$, and $31^{st}$ rows of light-emitting units in the first column of light-emitting units 101. The second signal line $F_4$ (i.e., j=4) in each group of second signal lines 103 is electrically connected to the $(4+(M/P)*(k-1))^{th}$ rows of light-emitting units in the first column of light-emitting units 101, substituting the values of M, P, and k into this formula, it can be obtained that the second signal line $F_4$ is electrically connected to the $4^{th}$, $8^{th}$, $12^{th}$, $16^{th}$, $20^{th}$, $24^{th}$, $28^{th}$, and $32^{nd}$ rows of light-emitting units in the first column of light-emitting units 101. When the first signal voltage is applied to the first signal line $E_1$, although the first signal line $E_1$ is electrically connected to the $1^{st}$-$4^{th}$ rows of light-emitting units in a column of light-emitting units 101, the first row of light-emitting unit in the column of light-emitting units 101 is electrically connected to the second signal line $F_1$, the second row of light-emitting unit in the column of light-emitting units 101 is electrically connected to the second signal line $F_2$, the third row of light-emitting unit in the column of light-emitting units 101 is electrically connected to the second signal line $F_3$, and the fourth row of light-emitting unit in the column of light-emitting units 101 is electrically connected to the second signal line $F_4$. Therefore, by controlling the second signal voltage (e.g., its magnitude, presence or not, etc.) applied to the second signal lines $F_1$, $F_2$, $F_3$, $F_4$, individual control of the brightness of each row of rows $1^{st}$-$4^{th}$ of light-emitting units in the column of light-emitting units 101 can be achieved. Similarly, through the cooperation of the first signal lines $E_2$, $E_3$, $E_4$, $E_5$, $E_6$, $E_7$, and $E_8$ with the second signal lines $F_1$, $F_2$, $F_3$, and $F_4$, respectively, the brightness of each light-emitting unit G in the column of light-emitting units 101 may be individually controllable.

As illustrated in FIG. 2, a corresponding group of second signal lines 103 is arranged between any two adjacent columns of light-emitting units in the N columns of light-emitting units. For example, a group of second signal lines 103 electrically connected to the first column of light-emitting units 101 is arranged between the first column of light-emitting units 101 and the second column of light-emitting units 101, a group of second signal lines 103 electrically connected to the second column of light-emitting units 101 is arranged between the second column of light-emitting units 101 and the third column of light-emitting units 101, a group of second signal lines 103 electrically connected to the $(N-1)^{th}$ column of light-emitting units 101 is arranged between the $(N-1)^{th}$ column of light-emitting units 101 and the $N^{th}$ column of light-emitting units 101. In the light-emitting area occupied by the plurality of light-emitting units G, the orthographic projection of all the second signal lines F on the array substrate 100 at least partially do not overlap with the orthographic projection of the plurality of light emitting units G on the array substrate 100. In an example, in the light-emitting area occupied by the plurality of light-emitting units G, the orthographic projection of all the second signal lines F on the array substrate 100 do not overlap with the orthographic projection of the plurality of light-emitting units G on the array substrate 100, that is, all the second signal lines F are arranged on the periphery of each light-emitting unit G, and have an appropriate interval with the light-emitting unit G. With such arrangement, the overlap between the second signal line F and the light-emitting elements in each light-emitting unit G and the overlap between the second signal line F and the connection line connecting the light-emitting elements are avoided, so that the crosstalk of the signal voltage on each second signal line F to the light-emitting unit G that is not electrically connected to the second signal line F can be reduced.

Figure 6:
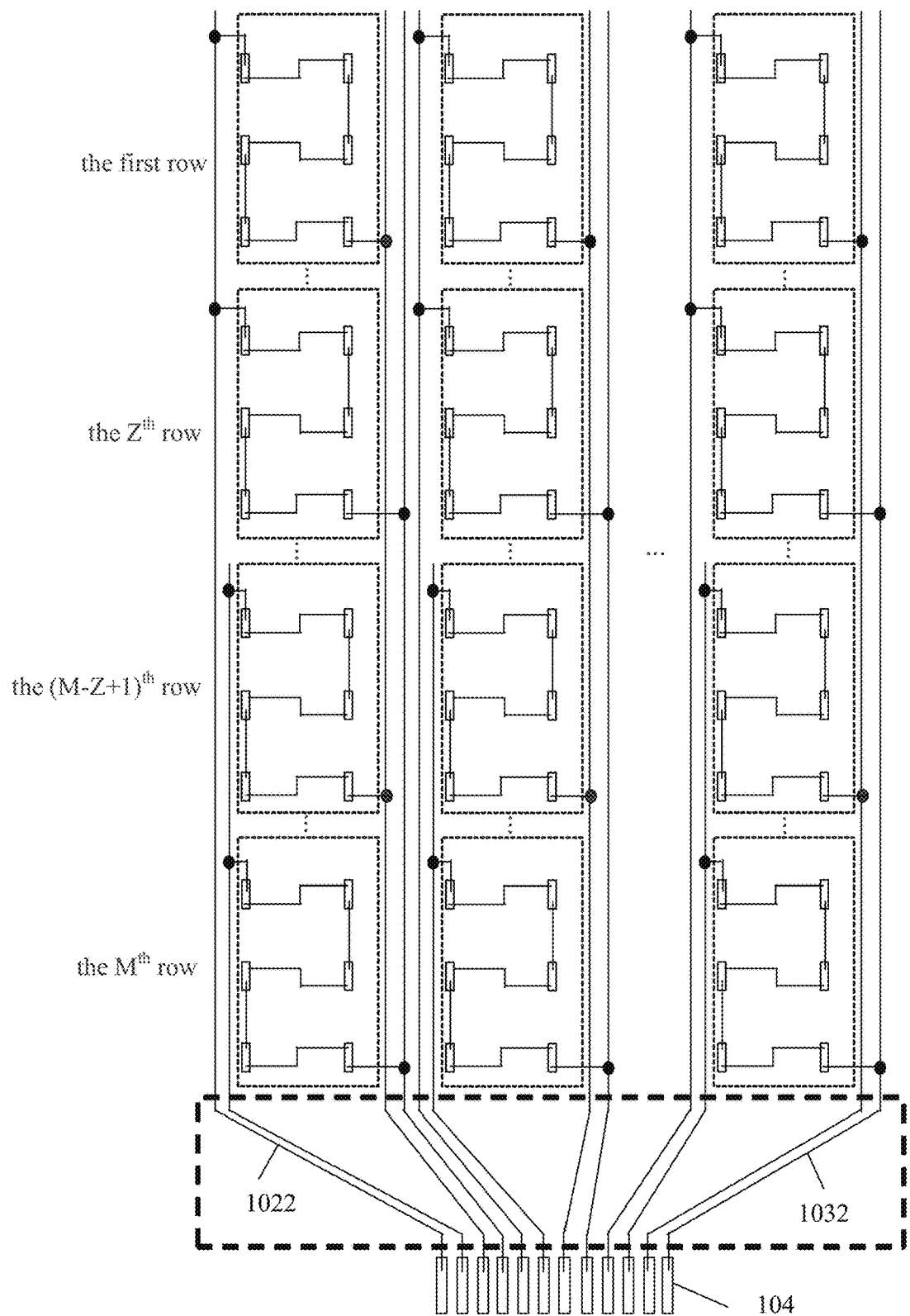
FIG. 6 illustrates a schematic diagram of the arrangement of the first signal lines and the second signal lines provided according to an embodiment of the present disclosure.

The array substrate 100 may further comprise a bonding electrode 104. FIG. 6 illustrates a wiring arrangement of the array substrate 100. As shown in FIG. 6, the bonding electrode 104 is located on the side of the $M^{th}$ row of light-emitting units away from the first row of light-emitting units. The bonding electrode 104 comprises a plurality of electrodes, and the plurality of electrodes of the bonding electrode 104 are in one-to-one correspondence with the plurality of gold fingers on the driving circuit (e.g., a flexible printed circuit (FPC) or an integrated circuit (IC)), and the electrical connection between the bonding electrode 104 and the driving circuit can be realized by anisotropic conductive film (ACF). A portion of the plurality of electrodes of the bonding electrode 104 are connected to the plurality of first signal lines E and are configured to apply the first signal voltage to the plurality of first signal lines E; the other portion of the plurality of electrodes of the bonding electrode 104 are connected to the plurality of second signal lines F and are configured to apply the second signal voltage to the plurality of second signal lines F. There is a voltage difference between the second signal voltage and the first signal voltage.

As illustrated in FIG. 6, each first signal line E comprises a bent portion 1022 close to the bonding electrode 104, and each second signal line F comprises a bent portion 1032 close to the bonding electrode 104. Each of the first signal lines E is electrically connected to the bonding electrode 104 through the bent portion 1022, and each of the second signal lines F is electrically connected to the bonding electrode 104 through the bent portion 1032. The bonding electrode 104 is electrically connected to the driving circuit (e.g., FPC or IC) via, for example, anisotropic conductive film, so that the driving circuit can apply the first signal voltage to the first signal lines E and the second signal voltage to the second signal line F through the bonding electrode 104. The orthographic projections of the bent portion 1022 of each first signal line E and the bent portion 1032 of each second signal line F on the array substrate 100 are located in the area (e.g., the fan-out area) between the orthographic projection of the $M^{th}$ row of light-emitting units on the array substrate 100 and the orthographic projection of the bonding electrode 104 on the array substrate 100, and the orthographic projections of the plurality of first signal lines E and the plurality of second signal lines F on the array substrate 100 do not overlap with the orthographic projection of the plurality of light-emitting units G on the array substrate 100. That is, the portion of each first signal line E and each second signal line F in the light-emitting area is located in the area between two adjacent columns of light-emitting units 101, and there is an appropriate distance between the bonding electrode 104 and the $M^{th}$ row of light-emitting units, so that the bent portion 1022 of each of the first signal lines E and the bent portion 1032 of each of the second signal lines F can be located in the area between the $M^{th}$ row of light-emitting units and the bonding electrode 104 (the area shown by the dashed box in the figure), thereby avoiding the overlapping of the first signal lines E and the second signal lines F with the light-emitting unit G. It is possible to reduce or even avoid the crosstalk of the signal voltage on each first signal line E to the light-emitting unit G that is not electrically connected to the first signal line E, and to reduce or even avoid the crosstalk of the signal voltage on each second signal line F to the light-emitting unit G that is not electrically connected to the second signal line F.

Figure 7:
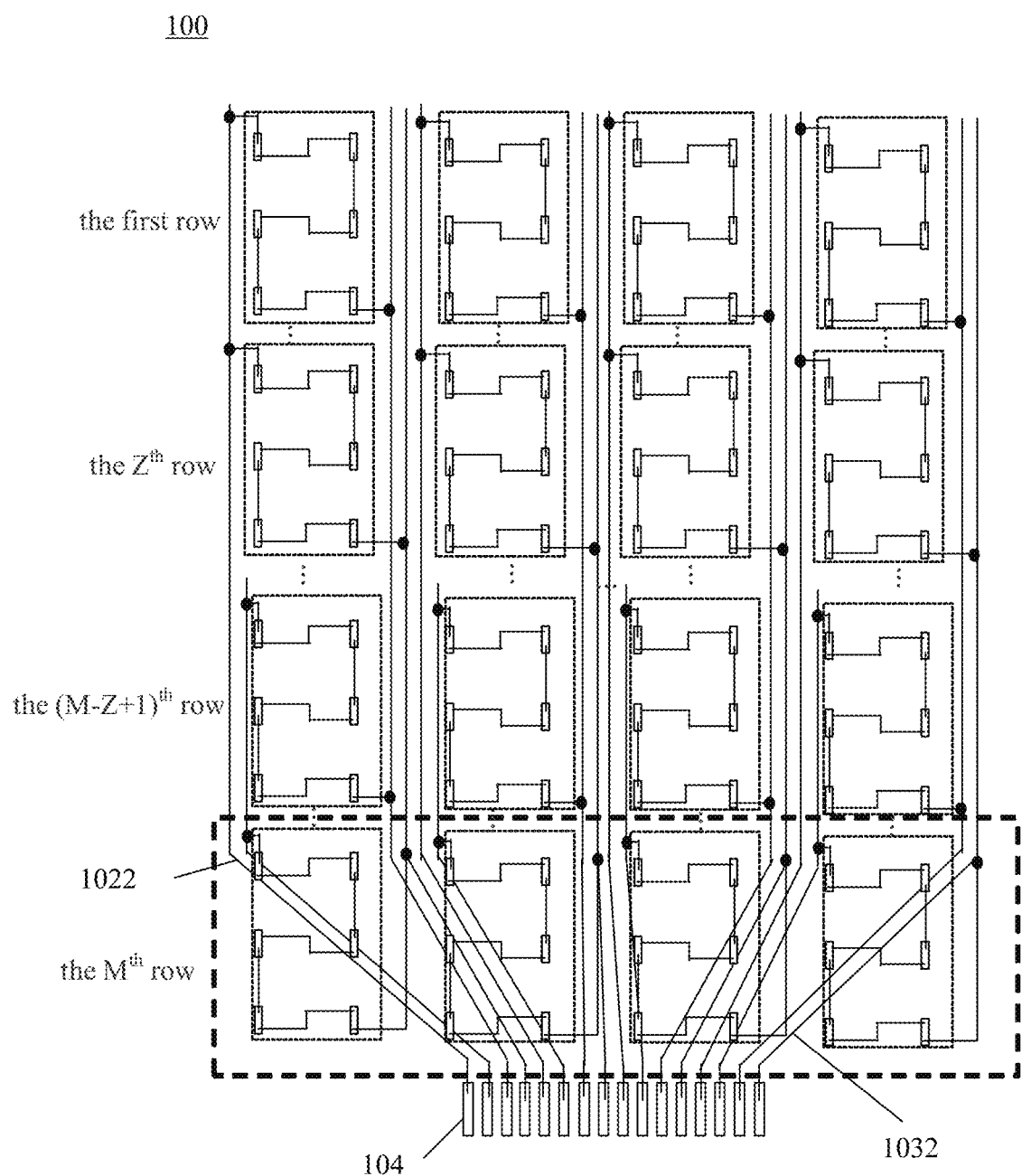
FIG. 7 illustrates another schematic diagram of the arrangement of the first signal lines and the second signal lines provided according to an embodiment of the present disclosure.
Figure 8:
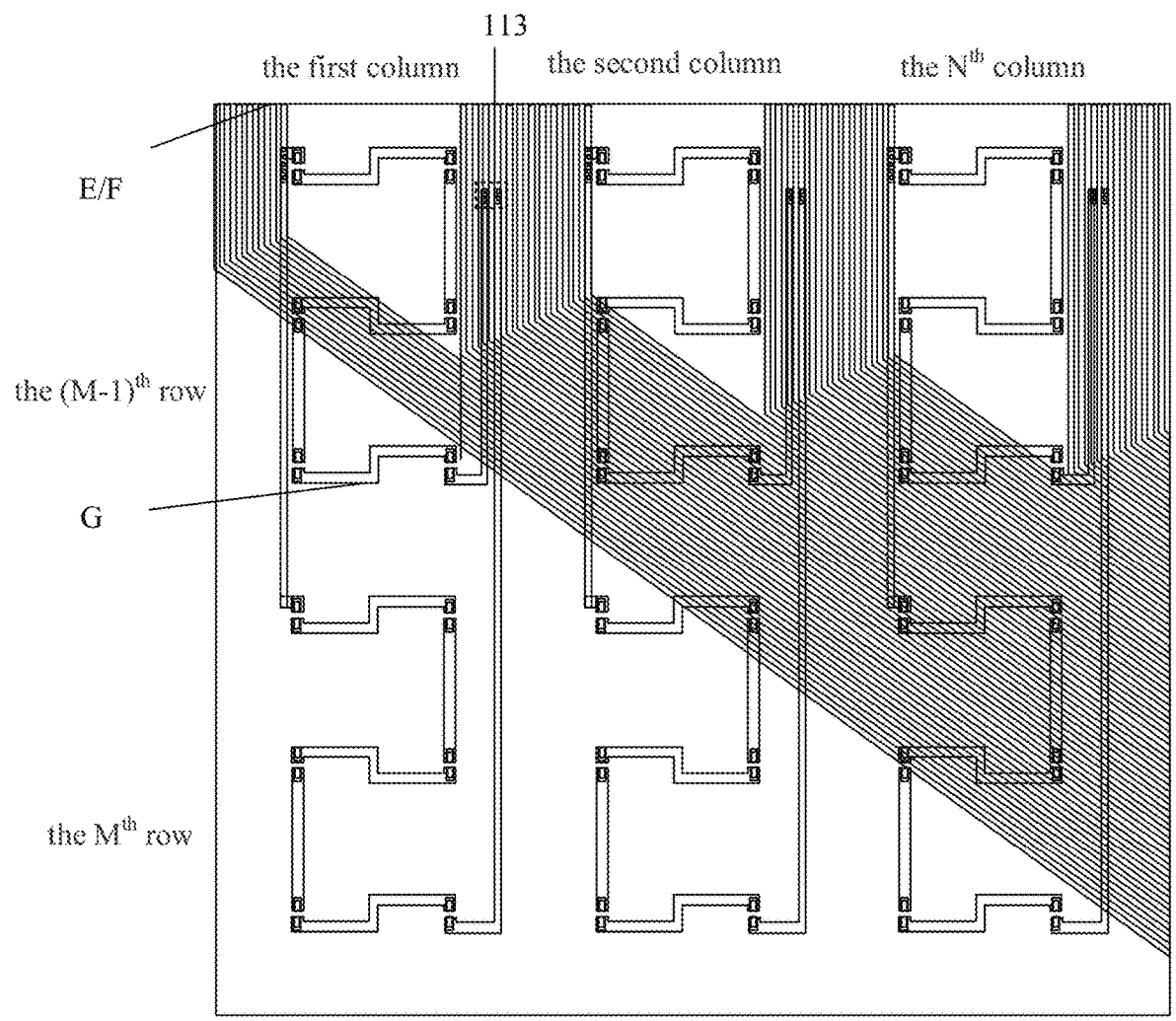
FIG. 8 illustrates yet another schematic diagram of the arrangement of the first signal lines and the second signal lines provided according to an embodiment of the present disclosure.

FIG. 7 illustrates another wiring arrangement of the array substrate 100. As illustrated in the figure, each first signal line E comprises a bent portion 1022 close to the bonding electrode 104, and each second signal line F comprises a bent portion 1032 close to the bonding electrode 104. Each of the first signal lines E is electrically connected to the bonding electrode 104 through the bent portion 1022, and each of the second signal lines F is electrically connected to the bonding electrode 104 through the bent portion 1032. The orthographic projections of the bent portion 1022 of each first signal line E and the bent portion 1032 of each second signal line F on the array substrate 100 at least overlap with the orthographic projection of the $M^{th}$ row of light-emitting units on the array substrate 100. Although FIG. 7 illustrates that the first signal lines E and the second signal lines F are bent from the position corresponding to the $M^{th}$ row of light-emitting units, that is, the orthographic projections of the bent portion 1022 of each first signal line E and the bent portion 1032 of each second signal line F on the array substrate 100 overlap with the orthographic projection of the $M^{th}$ row of light-emitting units on the array substrate 100, however, it should be noted that the embodiments of the present disclosure are not limited thereto. In an alternative embodiment, the first signal lines E and the second signal lines F may also be bent from the $(M-1)^{th}$ row, the $(M-2)^{th}$ row, or upwards, in this case, the orthographic projections of the bent portion 1022 of each first signal line E and the bent portion 1032 of each second signal line F on the array substrate 100 may overlap with the orthographic projection of the $(M-2)^{th}$ row of light-emitting units to the $M^{th}$ row of light-emitting units on the array substrate 100. For example, FIG. 8 illustrates a partial schematic diagram of the array substrate 100 in another embodiment, in this figure, only the $(M-1)^{th}$ row of light-emitting units and the $M^{th}$ row of light-emitting units are shown. The first signal lines E and the second signal lines F are bent from the position where the $(M-1)^{th}$ row of light-emitting units is located, and the orthographic projections of the bent portion 1022 of each first signal line E and the bent portion 1032 of each second signal line F on the array substrate 100 overlap with the orthographic projection of the $(M-1)^{th}$ row of light-emitting units and the $M^{th}$ row of light-emitting units on the array substrate 100. As illustrated in the figure, two via holes 113 are provided in each light-emitting unit G of the $(M-1)^{th}$ row of light-emitting units, and the light-emitting unit G located in the $(M-1)^{th}$ row and the $1^{st}$ column is connected to a first signal line E or a second signal line F through one of the two vias 113, the light-emitting unit G located in the $M^{th}$ row and the $1^{st}$ column is connected to a first signal line E or a second signal line F through the other one of the two vias 113. Similarly, the light-emitting unit G located in the $(M-1)^{th}$ row and the $2^{nd}$ column is connected to a first signal line E or a second signal line F through one of the two vias 113, and the light-emitting unit G located in the $M^{th}$ row and the $2^{nd}$ column is connected to a first signal line E or a second signal line F through the other one of the two vias 113. By analogy, the light-emitting unit G located in the $(M-1)^{th}$ row and the $N^{th}$ column is connected to a first signal line E or a second signal line F through one of the two vias 113, and the light-emitting unit G located in the $M^{th}$ row and the $N^{th}$ column is connected to a first signal line E or a second signal line F through the other one of the two vias 113.

By bending the first signal lines E and the second signal lines F at least from the $M^{th}$ row of the plurality of light-emitting units G arranged in an array, the frame of the array substrate 100 can be effectively reduced, thereby facilitating the realization of a narrow frame of the array substrate 100, so it is beneficial to maximize the proportion of the light-emitting area (of the light-emitting units G on the array substrate 100) on the array substrate 100.

Each light-emitting unit G comprises a plurality of light-emitting elements, and each light-emitting element may be an organic light-emitting diode or an inorganic light-emitting diode. In some embodiments, each light-emitting element may be a sub-millimeter light-emitting diode (Mini LED) or a micro light-emitting diode (Mirco LED). The size of the sub-millimeter light-emitting diode is, for example, in the range of 100 micrometers to 500 micrometers; the size of the micro light-emitting diode is, for example, less than 100 micrometers. The embodiments of the present disclosure do not limit the type and size of the light-emitting elements of the light-emitting unit G. Using sub-millimeter light-emitting diodes or micro light-emitting diodes as the light-emitting elements of the light-emitting unit G, combining the first signal lines E and the second signal lines F to independently control the brightness of each light-emitting unit G, a high-dynamic range (HDR) display can be achieved. When the array substrate 100 is applied to a display device, the contrast ratio of the display device can be significantly improved.

Figure 9A:
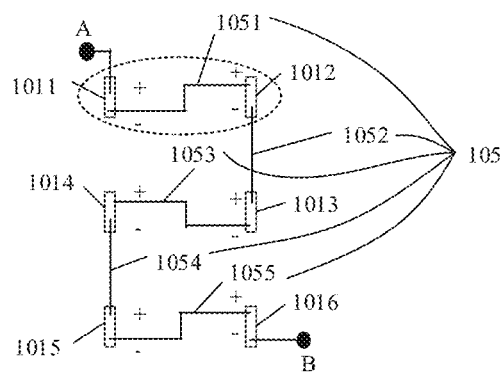
FIG. 9A illustrates a connection manner of a third signal line between light-emitting elements provided according to an embodiment of the present disclosure.

FIG. 9A illustrates a schematic diagram of a light-emitting unit G. The figure illustrates as an example that the light-emitting unit G comprises six light-emitting elements, and the six light-emitting elements may be Mini LEDs or Mirco LEDs. Of course, the number of light-emitting elements comprised in each light-emitting unit G can be flexibly changed according to actual requirements, and the embodiment of the present disclosure does not specifically limit the number of light-emitting elements comprised in each light-emitting unit G. As illustrated in the figure, each light-emitting unit G comprises a first light-emitting element 1011, a second light-emitting element 1012, a third light-emitting element 1013, a fourth light-emitting element 1014, a fifth light-emitting element 1015, and a sixth light-emitting element 1016. The six light-emitting elements are arranged on the base substrate 107 in the same manner, and are connected together in series through the third signal line 105. As illustrated in the figure, the third signal line 105 comprises a first segment 1051, a second segment 1052, a third segment 1053, a fourth segment 1054, and a fifth segment 1055. The first light-emitting element 1011 is electrically connected to the second light-emitting element 1012 through the first segment 1051 of the third signal line 105, the second light-emitting element 1012 is electrically connected to the third light-emitting element 1013 through the second segment 1052 of the third signal line 105, the third light-emitting element 1013 is electrically connected to the fourth light-emitting element 1014 through the third segment 1053 of the third signal line 105, the fourth light-emitting element 1014 is electrically connected to the fifth light-emitting element 1015 through the fourth segment 1054 of the third signal line 105, and the fifth light-emitting element 1015 is electrically connected to the sixth light-emitting element 1016 through the fifth segment 1055 of the third signal line 105. The first segment 1051, the third segment 1053, and the fifth segment 1055 of the third signal line 105 are all broken line segments. The first signal line E is electrically connected to one end of the corresponding light-emitting unit G at position A, and the second signal line F is electrically connected to the other end of the corresponding light-emitting unit G at position B. The six light-emitting elements illustrated in FIG. 9A are connected in series, and the circuit power consumption of the light-emitting unit G can be reduced and the temperature of the light-emitting unit G can be prevented from being too high with such connecting manner. Of course, the embodiments of the present disclosure do not limit the connection relationship between the light-emitting elements of the light-emitting unit G. In another example, the light-emitting elements may be connected in parallel. In yet another example, the light-emitting elements may be connected in a combination of series and parallel.

Figure 9B:
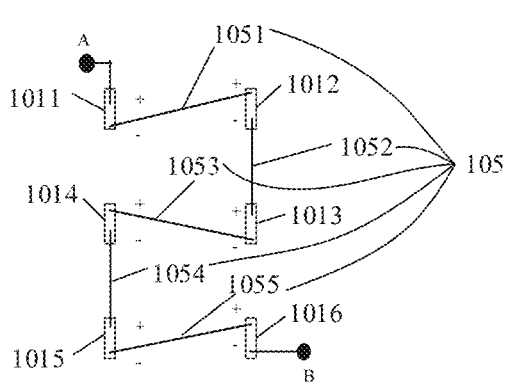
FIG. 9B illustrates another connection manner of a third signal line between light-emitting elements provided according to an embodiment of the present disclosure.
Figure 9C:
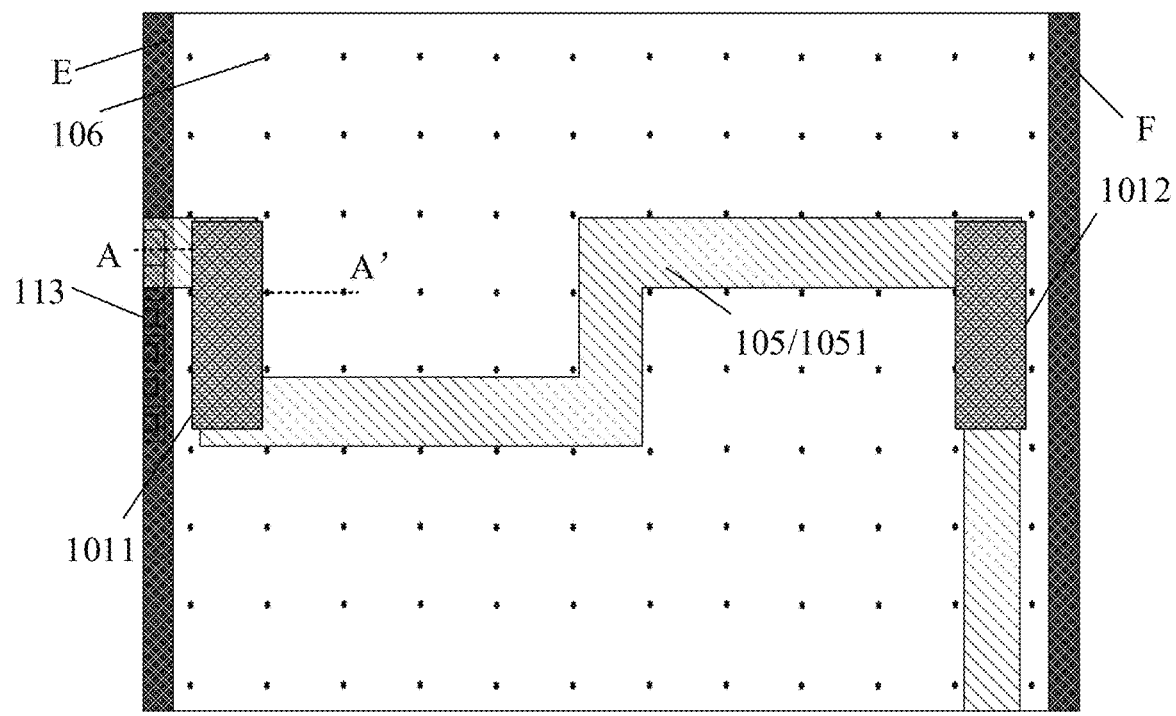
FIG. 9C illustrates a partial enlarged schematic view of FIG. 9A.

FIG. 9C illustrates a partial enlarged view within the dashed box area of FIG. 9A. As illustrated in the figure, the first light-emitting element 1011 is electrically connected to the second light-emitting element 1012 through the first broken line segment 1051 of the third signal line 105. The array substrate 100 further comprises a plurality of exhaust holes 106. The exhaust holes 106 are used for exhausting the gas formed by the organic layer (for example, the resin layer) in the array substrate 100, thereby preventing the risk of explosion of the layer in the array substrate 100 due to gas accumulation, and the exhaust hole 106 will be described in more detail below. By designing the first segment 1051 (as well as the third segment 1053 and the fifth segment 1055) of the third signal line 105 as the broken line segment, the third signal line 105 can avoid the exhaust hole 106 without overlapping with the exhaust hole 106, that is, the orthographic projection of the third signal line 105 on the array substrate 100 does not overlap with the orthographic projection of the exhaust hole 106 on the array substrate 100. This wiring method of the third signal line 105, on the one hand, can prevent the third signal line 105 from covering the exhaust hole 106, which will affect the exhaust of the array substrate 100 through the exhaust hole 106 to lead to the risk of film explosion; on the other hand, the exhaust holes 106 can be arranged evenly and regularly, and there is no need to not set the exhaust holes 106 in some areas in order to avoid the third signal line 105, so that the exhaust holes 106 are not evenly distributed and cannot uniformly discharge gas.

FIG. 9B illustrates another schematic diagram of a light-emitting unit G. The connection method of each light-emitting element in FIG. 9B is basically the same as that in FIG. 9A, except that the first segment 1051, the second segment 1052, the third segment 1053, the fourth segment 1054 and the fifth segment 1055 of the third signal line 105 are all straight line segments. By designing each line segment of the third signal line 105 to be a straight line segment, the lengths of the first segment 1051, the second segment 1052, the third segment 1053, the fourth segment 1054 and the fifth segment 1055 can be reduced, thereby reducing the resistance of the third signal line 105.

Figure 10:
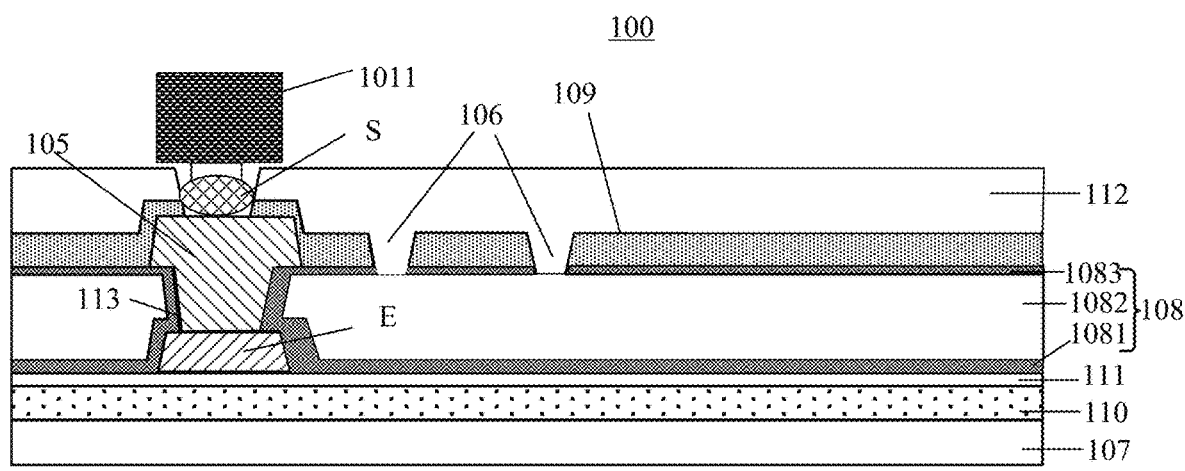
FIG. 10 illustrates a cross-sectional view of the array substrate taken along the line AA' of FIG. 9C.

FIG. 10 illustrates a cross-sectional view of the array substrate 100 taken along the line AA' in FIG. 9C. As illustrated in the figure, the array substrate 100 further comprises a substrate 107. The plurality of first signal lines E and the plurality of second signal lines F are located on the substrate 107 and are located on the same layer, and the plurality of third signal lines 105 are located on the side of the layer where the plurality of first signal lines E and the plurality of second signal lines F are located away from the substrate 107, and an insulating layer is provided between the plurality of third signal lines 105 and the layer where the plurality of first signal lines E and the plurality of second signal lines F are located. The substrate 107 may be a flexible or rigid material, specifically, may be PEN resin, silicone resin, polyimide, glass, quartz, plastic, or the like. The first signal lines E and the second signal lines F can be electrically connected to both ends of the light-emitting unit G through the vias 113 respectively. For example, the first signal line E is electrically connected to the first end A of the light-emitting unit G through the via 113 at the position A, the second signal line F is electrically connected to the light-emitting unit G through the via 113 at the position B, so that, different signal voltages can be applied on both sides of the light-emitting unit G to control the light-emitting unit G to emit light. The first signal lines E and the second signal lines F may be made of the same conductive material (e.g., metal), and the third signal line 105 may be made of a conductive material (e.g., metal). The material of the third signal line 105 may be the same as or different from the material of the first signal lines E and the material of the second signal lines F.

Continuing to refer to FIG. 10, the array substrate 100 further comprises a first insulating layer 108 and a second insulating layer 109. The first insulating layer 108 is located between the layer where the third signal lines 105 are located and the layer where the first signal lines E and the second signal lines F are located, and the second insulating layer 109 is located on the side of the layer where the third signal lines 105 are located away from the substrate 107. The first insulating layer 108 and the second insulating layer 109 may be a single-layer structure, respectively, or may respectively comprise a plurality of layer structures. In the example illustrated in FIG. 10, the first insulating layer 108 comprises a first sub-insulating layer 1081, a second sub-insulating layer 1082, and a third sub-insulating layer 1083. The first sub-insulating layer 1081 and the third sub-insulating layer 1083 may be, for example, inorganic layers, and the second sub-insulating layer 1082 may be, for example, an organic layer, such as a resin layer. The material of the second insulating layer 109 may be an inorganic material. The via hole 113 penetrates through the first sub-insulating layer 1081, the second sub-insulating layer 1082 and the third sub-insulating layer 1083 of the first insulating layer 108. The second insulating layer 109 exposes a part of the surface of the layer where the third signal lines 105 are located, the surface being away from the substrate 107, so as to be connected with the light-emitting element. In an example, the exposed region of the layer where the third signal lines 105 are located may be processed by a electroless nickel and immersion gold process, and then a solid electrical connection is formed with the pins of the light-emitting element 1011 (such as a mini-LED) through the soldering material S (such as soldering tin).

As illustrated in FIG. 10, the exhaust hole 106 is formed by penetrating the second insulating layer 109 and the third sub-insulating layer 1083 of the first insulating layer 108. The penetrating portion of the second insulating layer 109 and the penetrating portion of the third sub-insulating layer 1083 may be formed as sleeve holes, thereby constituting the exhaust hole 106. The exhaust hole 106 is used for exhausting the gas formed by the organic layer (e.g., the second sub-insulating layer 1082) in the array substrate 100, so as to prevent the gas accumulation in the array substrate 100 from causing local explosion of the layer. As mentioned above, the orthographic projection of the third signal line 105 on the array substrate 100 does not overlap with the orthographic projection of the exhaust hole 106 on the array substrate 100.

Referring to FIG. 10, the array substrate 100 may further comprise structures such as a third insulating layer 110, a buffer layer 111, and a fourth insulating layer 112. Embodiments of the present disclosure do not limit the materials of the third insulating layer 110, the buffer layer 111, and the fourth insulating layer 112. In an example, the material of the third insulating layer 110 may be polyimide, and the material of the fourth insulating layer 112 may be resin. In an example, the substrate 107 is a rigid base, and the material of the third insulating layer 110 is polyimide. During the preparation process of the array substrate 100, after the third insulating layer 110 and some other layers are sequentially formed on the substrate 107, the substrate 107 is peeled off, so that the third insulating layer 110 is used as the base layer of the final product.

Figure 11:
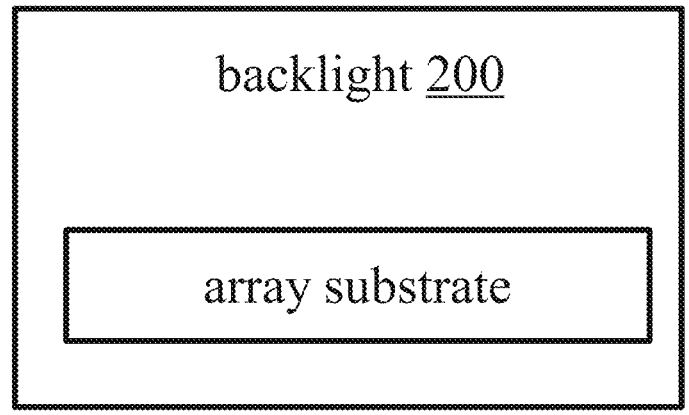
FIG. 11 illustrates a block diagram of a backlight provided according to another embodiment of the present disclosure.

According to another aspect of the present disclosure, there is provided a backlight, and FIG. 11 illustrates a block diagram of a backlight 200 comprising the array substrate described in any of the foregoing embodiments. The backlight 200 can be used as a backlight in a display device to provide a display light source for a display panel in the display device. Of course, the backlight 200 can also be used in any other device that requires a light source, and the embodiments of the present disclosure do not specifically limit the use of the backlight 200.

Since the backlight 200 can have substantially the same technical effects as the array substrate 100 described in the previous embodiments, for the sake of brevity, the technical effects of the backlight 200 are not repeated here.

Figure 12:
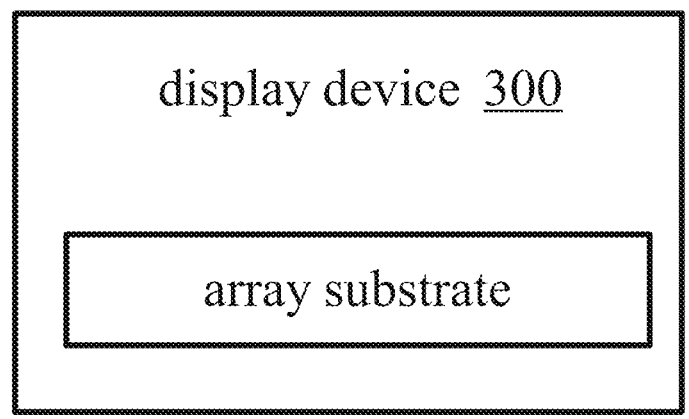
FIG. 12 illustrates a block diagram of a display device provided according to yet another embodiment of the present disclosure.

According to yet another aspect of the present disclosure, there is provided a display device, and FIG. 12 illustrates a block diagram of a display device 300 comprising the array substrate described in any of the foregoing embodiments. In some embodiments, the display device 300 may be a liquid crystal display device, which comprises a liquid crystal panel and a backlight disposed on a non-display side of the liquid crystal panel, the backlight comprises the array substrate described in any of the preceding embodiments and may, for example, be used to implement HDR dimming for display operation. The liquid crystal display device can have more uniform backlight brightness and better display contrast.

Since the display device 300 can have substantially the same technical effects as the array substrate 100 described in the previous embodiments, for the sake of brevity, the technical effects of the display device 300 are not repeated here.

Spatially relative terms such as "row", "column", "below", "under", "lower", "underneath", "above", "higher", etc. may be used herein for ease of description to describe the relationship of one element or feature to other element(s) or feature(s) as illustrated in the figures. It will be understood that these spatially relative terms are intended to encompass different orientations of the device in use or operation in addition to the orientation depicted in the figures. For example, if the device in the figures is turned over, the elements described as "under other elements or features" or "below other elements or features" or "beneath other elements or features" would be oriented "above other elements or features". Thus, the exemplary terms "under" and "below" can encompass both an orientation of above and below. The device may be otherwise oriented (rotated 90 degrees or at other orientations) and interpreted with the spatially relative descriptors used herein accordingly. In addition, it will also be understood that when a layer is referred to as being "between" two layers, it can be the only layer between the two layers, or one or more intervening layers may also be present.

In the description of this specification, description with reference to the terms "one embodiment," "another embodiment," etc. means that a particular feature, structure, material, or characteristic described in connection with the embodiment is comprised in at least one embodiment of the present disclosure. In this specification, schematic representations of the above terms are not necessarily directed to the same embodiment or example. Furthermore, the particular features, structures, materials or characteristics described may be combined in any suitable manner in any one or more embodiments or examples. Furthermore, those skilled in the art may combine the different embodiments or examples described in this specification, as well as the features of the different embodiments or examples, without conflicting each other. In addition, it should be noted that in this specification, the terms "first" and "second" are only used for description purposes, and cannot be understood as indicating or implying relative importance or implicitly indicating the number of indicated technical features.

As those skilled in the art will understand, although the various steps of the methods of the present disclosure are depicted in the figures in a particular order, this does not require or imply that the steps must be performed in that particular order, unless the context clearly indicates otherwise. Additionally or alternatively, multiple steps may be combined into one step for execution, and/or one step may be decomposed into multiple steps for execution. Furthermore, other method steps may be inserted between the steps. The inserted steps may represent improvements to the method such as those described herein, or may be unrelated to the method. Additionally, a given step may not be fully completed before the next step begins.

Embodiments of the present disclosure are described herein with reference to schematic illustrations (and intermediate structures) of idealized embodiments of the present disclosure. As such, variations to the shapes of the illustrations are to be expected, e.g., as a result of manufacturing techniques and/or tolerances. Accordingly, embodiments of the present disclosure should not be construed as limited to the particular shapes of the regions illustrated herein, but are to comprise deviations in shapes due to manufacturing, for example. Thus, the regions illustrated in the figures are schematic in nature and their shapes are not intended to illustrate the actual shape of a region of a device and are not intended to limit the scope of the present disclosure.

The above descriptions are merely specific embodiments of the present disclosure, but the protection scope of the present disclosure is not limited thereto. Any person skilled in the art can easily think of changes or substitutions within the technical scope disclosed by the present disclosure, which should be comprised within the protection scope of the present disclosure. Therefore, the protection scope of the present disclosure should be based on the protection scope of the claims.

The invention claimed is:

1. An array substrate comprising:
   a plurality of light-emitting units arranged in an array, the plurality of light-emitting units being arranged in M rows along a first direction and in N columns along a second direction intersecting with the first direction; and
   a plurality of first signal lines extending along the first direction, the plurality of first signal lines being divided into N groups, the N groups of first signal lines being in one-to-one correspondence with the N columns of light-emitting units, and each of the N groups of first signal lines being electrically connected to a column of light-emitting units corresponding to the group of first signal lines,
   wherein each group of first signal lines comprises at least two first signal lines, for each column of light-emitting units, at least two consecutive rows of light-emitting units in the column of light-emitting units are electrically connected to one of the at least two first signal lines, and the remaining at least one row of light-emitting unit in the column of light-emitting units except the at least two consecutive rows of light-emitting units is electrically connected to the other one of the at least two first signal lines, M is a positive integer greater than or equal to 3, and N is a positive integer greater than or equal to 1.

2. The array substrate according to claim 1,
   wherein each group of first signal lines comprises P first signal lines, and for each column of light-emitting units, the light-emitting units in the row $(1+(M/P)*(i-1))^{th}$ to the row $((M/P)*i)^{th}$ of the column of light-emitting units are all electrically connected to the $i^{th}$ first signal line among the P first signal lines, and
   wherein P is a positive integer greater than or equal to 2 and less than M and is a divisor of M, and i is a positive integer greater than or equal to 1 and less than or equal to P.

3. The array substrate according to claim 2, further comprising:
   a light-emitting area comprising the plurality of light-emitting units,
   wherein the plurality of first signal lines are at least arranged between any two adjacent columns of the N columns of light-emitting units, and in the light-emitting area, an orthographic projection of the plurality of first signal lines on the array substrate and an orthographic projection of the plurality of light-emitting units on the array substrate at least partially do not overlap.

4. The array substrate according to claim 2, wherein lengths of the P first signal lines are different from each other, and the length of the (i−1)th first signal line among the P first signal lines is greater than the length of the $i^{th}$ first signal line among the P first signal lines, and the $i^{th}$ first signal line among the P first signal lines refers to the $i^{th}$ first signal line along the second direction among the P first signal lines.

5. The array substrate according to claim 4, wherein a difference between the length of the (i−1)th first signal line and the length of the $i^{th}$ first signal line among the P first signal lines is equal to a difference between the length of the $i^{th}$ first signal line and the length of the (i+1)th first signal line among the P first signal lines.

6. The array substrate according to claim 4, wherein a width of each of the first to (P−1)th first signal lines among the P first signal lines gradually becomes wider in a direction from the $M^{th}$ row of light-emitting units to the first row of light-emitting units, the width refers to the width of each of the first to (P−1)th first signal lines in a direction perpendicular to the extending direction of the first signal line.

7. The array substrate according to claim 6,
   wherein the $i^{th}$ first signal line among the P first signal lines comprises P+1−1 segments, and each of the P+1−1 segments has a same length but a different width, and any two adjacent segments with different widths of the P+1−1 segments are connected by a transition segment, and
   wherein a width of the $(X−1)^{th}$ segment of the $i^{th}$ first signal line is less than a width of the $X^{th}$ segment of the $i^{th}$ first signal line, $1 \leq X \leq P+1−1$.

8. The array substrate according to claim 7, wherein the width of the $X^{th}$ segment of the $i^{th}$ first signal line among the P first signal lines is equal to a width of the $X^{th}$ segment of the (i+1)th first signal line among the P first signal lines.

9. The array substrate according to claim 4, wherein each of the P first signal lines has a different width and a same resistance, and the width refers to the width of each of the P first signal lines in a direction perpendicular to the extending direction of the first signal line.

10. The array substrate according to claim 9, wherein each of the P first signal lines has the same width along the extending direction.

11. The array substrate according to claim 2, further comprising:
a plurality of second signal lines extending along the first direction,
wherein the plurality of second signal lines are divided into N groups, the N groups of second signal lines are in one-to-one correspondence with the N columns of light-emitting units, and each of the N groups of second signal lines is electrically connected to a column of light-emitting units corresponding to the group of second signal lines,
wherein each group of second signal lines comprises Z second signal lines, and for each column of light-emitting units, the $(j+(M/P)*(k-1))^{th}$ rows of light-emitting units in the column of light-emitting units are all electrically connected to the $j^{th}$ second signal line among the Z second signal lines, and
wherein Z is equal to M/P, j is a positive integer greater than or equal to 1 and less than or equal to M/P, and k is selected from all positive integers from 1 to P.

12. The array substrate according to claim 11, further comprising:
a light-emitting area comprising the plurality of light-emitting units,
wherein the plurality of second signal lines are at least arranged between any two adjacent columns of the N columns of light-emitting units, and in the light-emitting area, an orthographic projection of the plurality of second signal lines on the array substrate and an orthographic projection of the plurality of light-emitting units on the array substrate at least partially do not overlap.

13. The array substrate according to claim 11, further comprising:
a bonding electrode,
wherein the bonding electrode is on a side of the $M^{th}$ row of light-emitting units away from the first row of light-emitting units, and
wherein the plurality of first signal lines and the plurality of second signal lines comprise bent portions, and the plurality of first signal lines and the plurality of second signal lines are electrically connected to the bonding electrode respectively via the bent portions.

14. The array substrate according to claim 13, wherein an orthographic projection of the bent portions of the plurality of first signal lines and the plurality of second signal lines on the array substrate at least overlap with an orthographic projection of the $M^{th}$ row of light-emitting units on the array substrate.

15. The array substrate according to claim 1, wherein each of the plurality of light-emitting units comprises a plurality of light-emitting elements, the plurality of light-emitting elements are electrically connected to each other via a third signal line, one end of the third signal line is electrically connected to a corresponding one of the first signal lines, and the other end of the third signal line is electrically connected to a corresponding one of the second signal lines.

16. The array substrate according to claim 15, wherein a portion of the third signal line between two adjacent light-emitting elements of the plurality of light-emitting elements comprises a broken line segment.

17. The array substrate according to claim 15, wherein a portion of the third signal line between two adjacent light-emitting elements of the plurality of light-emitting elements comprises a straight line segment.

18. The array substrate according to claim 15, further comprising:
a substrate,
wherein the plurality of first signal lines and the plurality of second signal lines are on the substrate and are in a same layer, the plurality of third signal lines are on a side of the layer where the plurality of first signal lines and the plurality of second signal lines are located away from the substrate, and
wherein the plurality of first signal lines and the plurality of second signal lines are respectively electrically connected to the plurality of third signal lines via holes.

19. The array substrate according to claim 18, further comprising
a first insulating layer between a layer where the plurality of third signal lines are located and the layer where the plurality of first signal lines and the plurality of second signal lines are located, and a material of the first insulating layer comprising organic material; and
a plurality of exhaust holes on a side of the first insulating layer away from the substrate.

20. The array substrate according to claim 19, wherein an orthographic projection of the plurality of third signal lines on the array substrate does not overlap with an orthographic projection of the plurality of exhaust holes on the array substrate.

21. The array substrate according to claim 11,
wherein each of the first signal lines is configured to receive a first signal voltage, each of the second signal lines is configured to receive a second signal voltage, and
wherein there is a voltage difference between the first signal voltage and the second signal voltage.

22. The array substrate according to claim 1, wherein each of the plurality of light-emitting units comprises at least one sub-millimeter light-emitting diode or micro light-emitting diode.

23. A backlight comprising the array substrate according to claim 1.

24. A display device comprising the array substrate according to claim 1.

* * * * *